United States Patent

Shigehara et al.

[11] Patent Number: 5,552,723
[45] Date of Patent: Sep. 3, 1996

[54] CMOS OUTPUT CIRCUIT COMPENSATING FOR BACK-GATE BIAS EFFECTS

[75] Inventors: Hiroshi Shigehara, Tokyo; Masanori Kinugasa, Yokohama, both of Japan

[73] Assignee: Kabushiki Kaisha Toshiba, Kawasaki, Japan

[21] Appl. No.: 264,853

[22] Filed: Jun. 23, 1994

Related U.S. Application Data

[63] Continuation of Ser. No. 917,936, Jul. 24, 1992, abandoned.

[30] Foreign Application Priority Data

Jul. 26, 1991 [JP] Japan .................................. 3-187569

[51] Int. Cl.$^6$ ................ H03K 19/0944; H03K 19/0185
[52] U.S. Cl. .......................... 326/86; 326/119; 326/57; 327/534
[58] Field of Search ...................... 307/443, 451, 307/296.2, 448, 475; 326/83, 86–87, 112, 119, 121, 15, 21, 27, 57–58; 327/534, 537

[56] References Cited

U.S. PATENT DOCUMENTS

| | | | |
|---|---|---|---|
| 4,324,991 | 4/1982 | Tamaki | 307/443 |
| 4,529,897 | 7/1985 | Suzuki et al. | 307/296.2 |
| 4,789,917 | 8/1987 | Miller | 361/56 |
| 4,956,691 | 9/1990 | Culley et al. | 307/448 |
| 4,959,563 | 9/1990 | Schenck | 307/448 |
| 5,004,936 | 4/1991 | Andresen | 307/443 |
| 5,057,715 | 10/1991 | Larsen et al. | 307/443 |
| 5,068,553 | 11/1991 | Love | 307/448 |
| 5,157,279 | 10/1992 | Lee | 307/451 |
| 5,160,855 | 11/1992 | Dobberpuhl | 326/62 |
| 5,191,244 | 3/1993 | Runaldue et al. | 307/475 |
| 5,332,932 | 7/1994 | Runaldue | 307/451 |

FOREIGN PATENT DOCUMENTS

| | | | |
|---|---|---|---|
| 63-82019 | 4/1988 | Japan | 307/448 |
| 2-305223 | 12/1990 | Japan | 307/448 |
| 3-38917 | 2/1991 | Japan | 307/448 |

*Primary Examiner*—Edward P. Westin
*Assistant Examiner*—Jon Santamauro
*Attorney, Agent, or Firm*—Banner & Allegretti, Ltd.

[57] ABSTRACT

An output circuit according to the present invention comprises an input terminal, first and second MOS transistors of a same conductivity type connected in series between first and second power supplies to form a current path, and alternately turned on in response to an input signal from the input terminal, an output terminal connected to a connection point of the current path of the first and second MOS transistors, and a switching element having a current path one end of which is connected to the output terminal and another end of which is connected to a back gate of the first MOS transistor, for performing a switching operation in response to the input signal from the input terminal, the switching element preventing a parasitic diode generated between the back gate of the first MOS transistor and the first power supply from turning on, and controlling a potential of the back gate of the first MOS transistor.

16 Claims, 16 Drawing Sheets

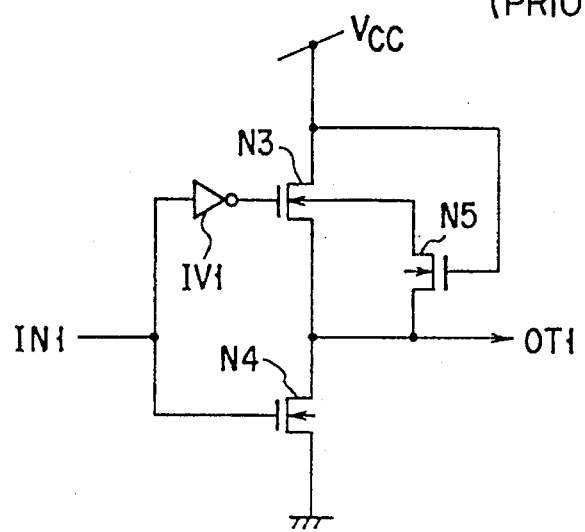
F I G. 3

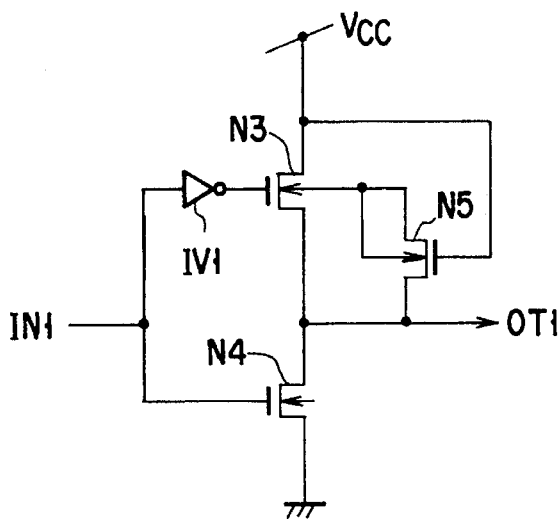
F I G. 4
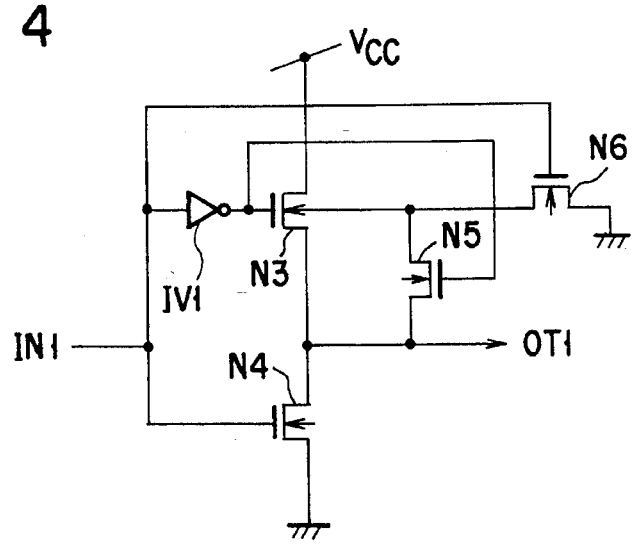
F I G. 5
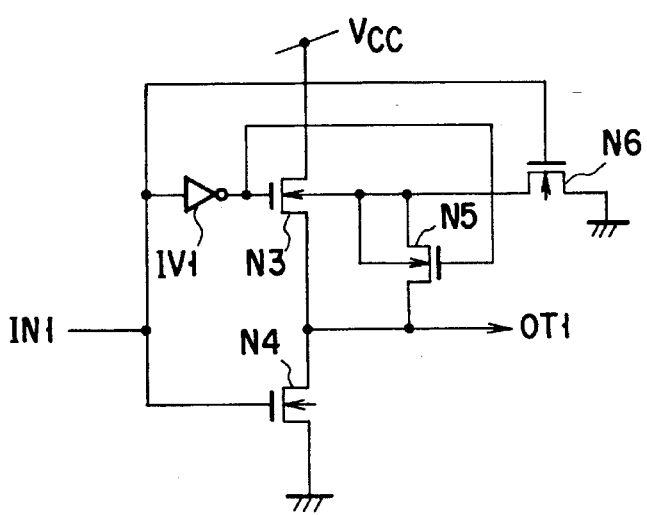
F I G. 6

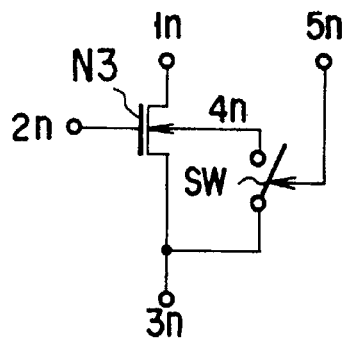
F I G. 7A
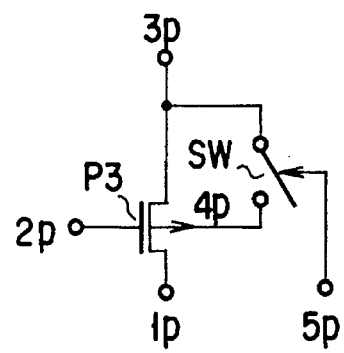
F I G. 7B
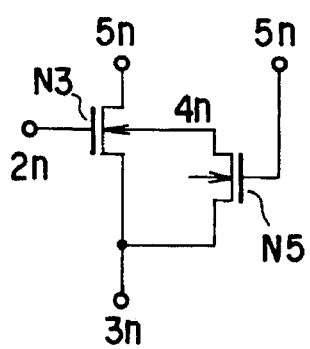
F I G. 8A
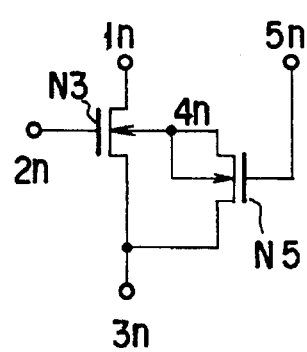
F I G. 8B
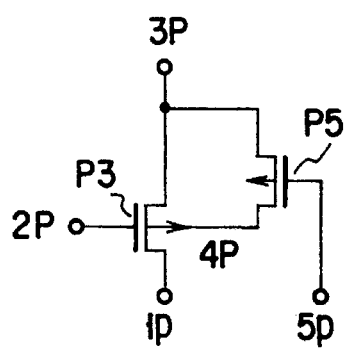
F I G. 9A
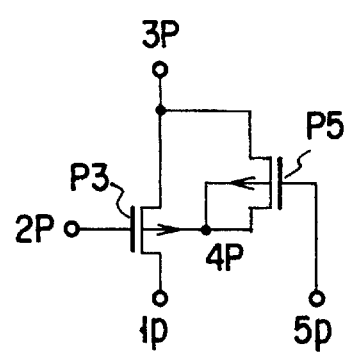
F I G. 9B

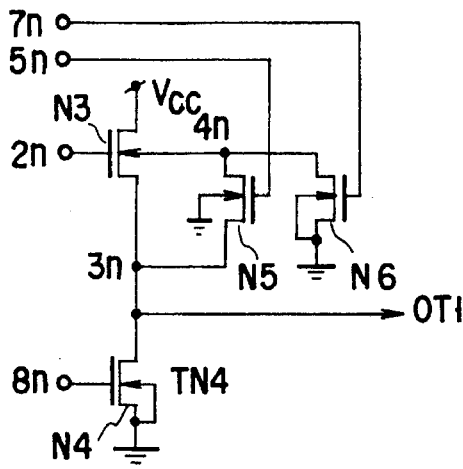
FIG. 13A
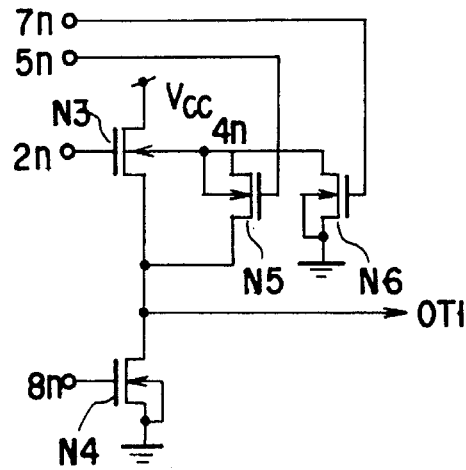
FIG. 13B
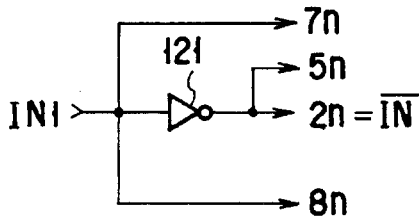
FIG. 14A
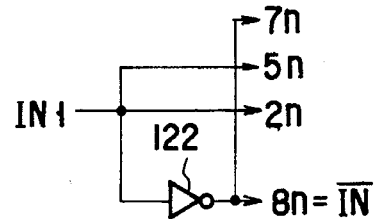
FIG. 14B
FIG. 15A
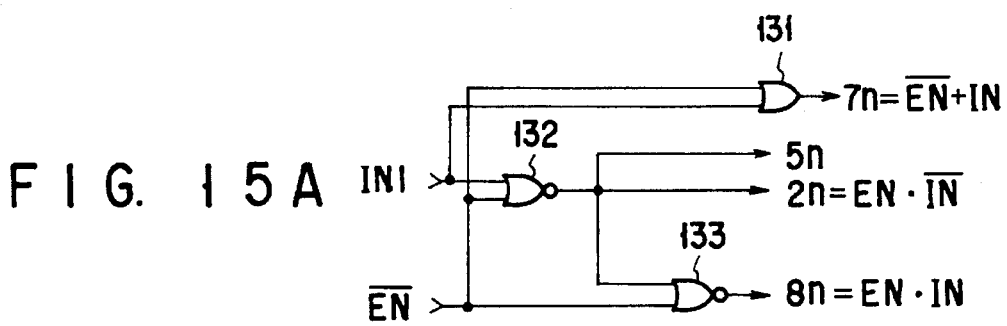
FIG. 15B
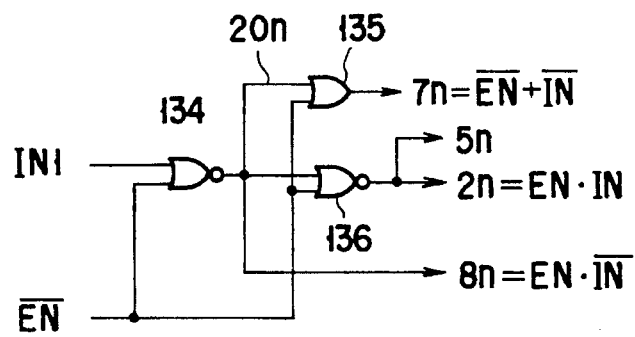

$7n = \overline{EN} + IN$
$5n = EN + \overline{IN}$
$2n$
$8n = EN \cdot IN$

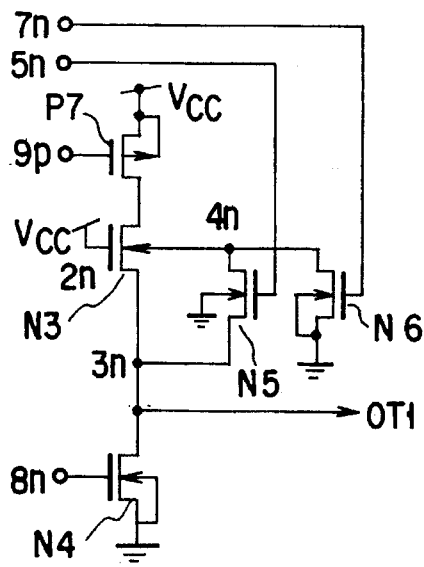
F I G. 19A
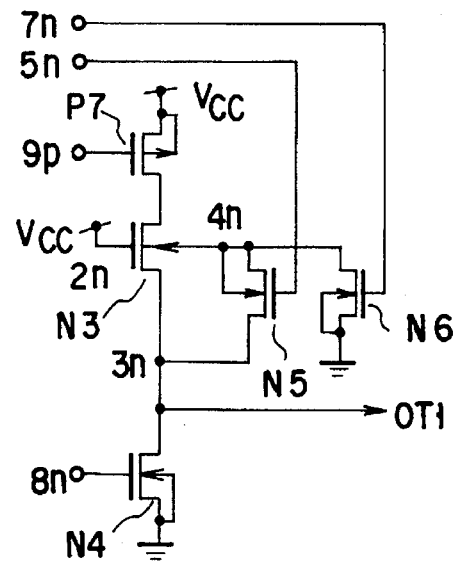
F I G. 19B
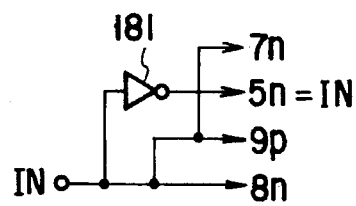
F I G. 20A
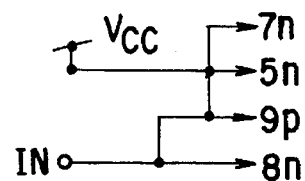
F I G. 20B
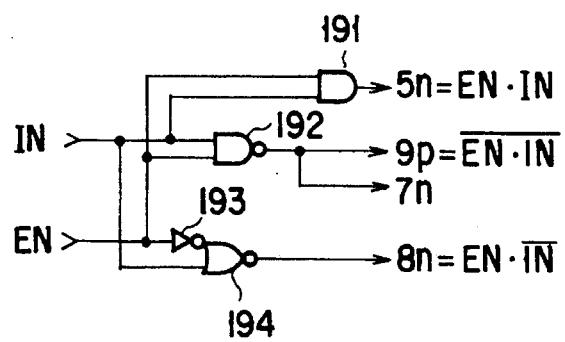
F I G. 21

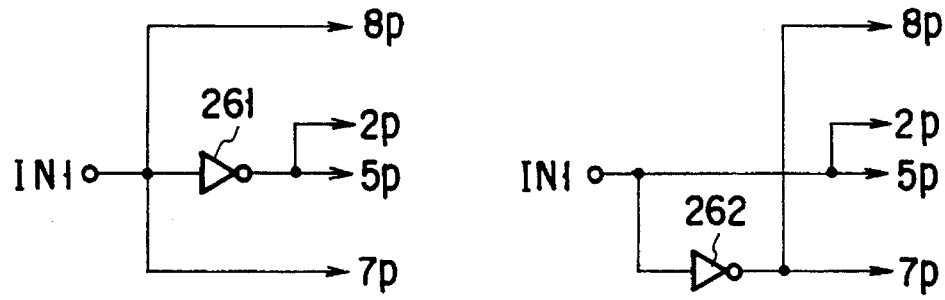
F I G. 28A  F I G. 28B
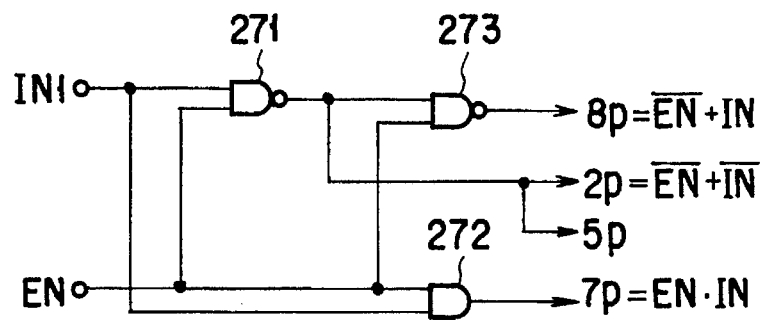
F I G. 29A
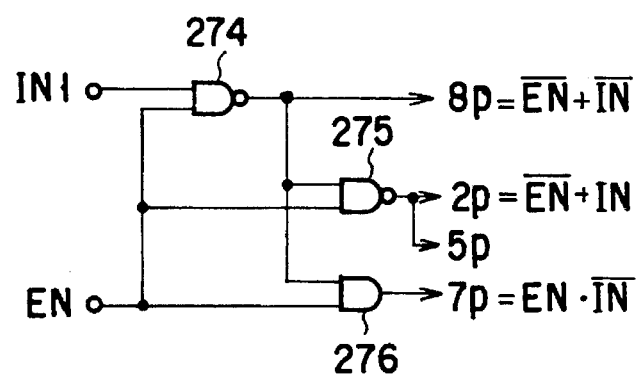
F I G. 29B

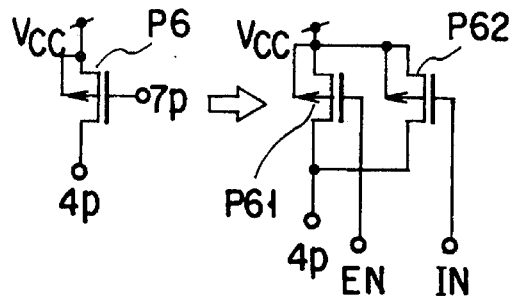
F I G. 30A
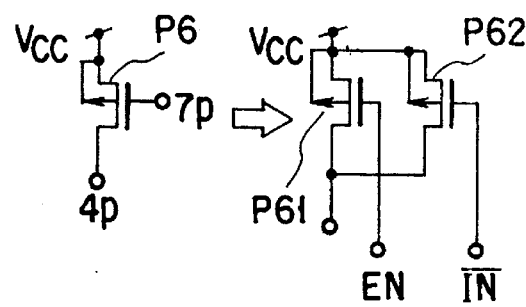
F I G. 30B
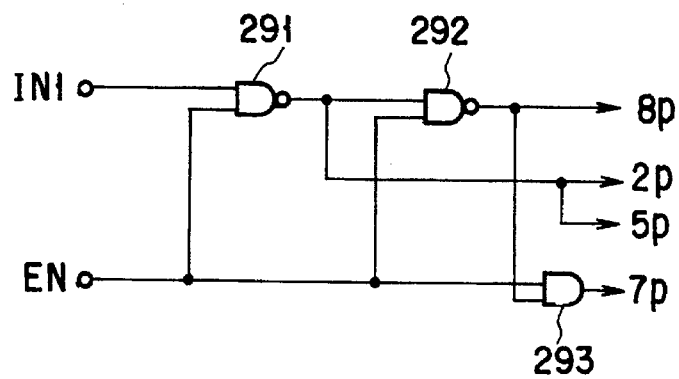
F I G. 31
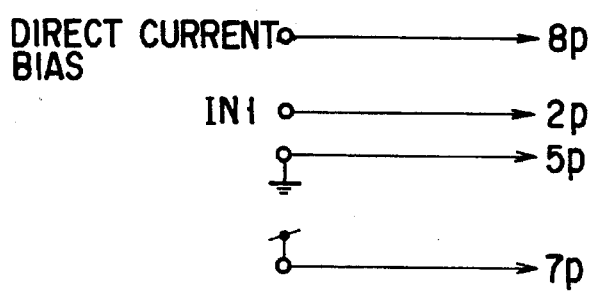
F I G. 32

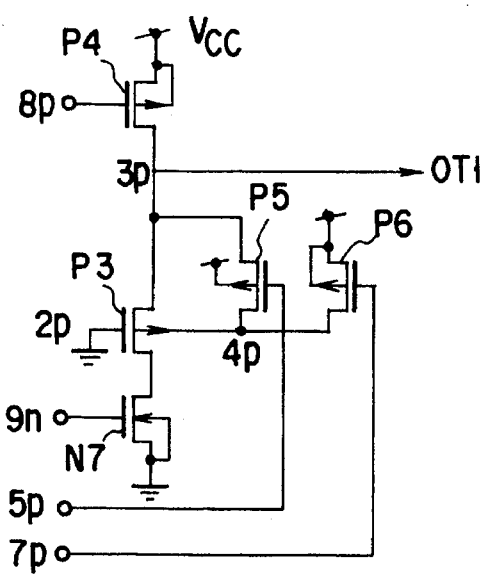
F I G. 33A
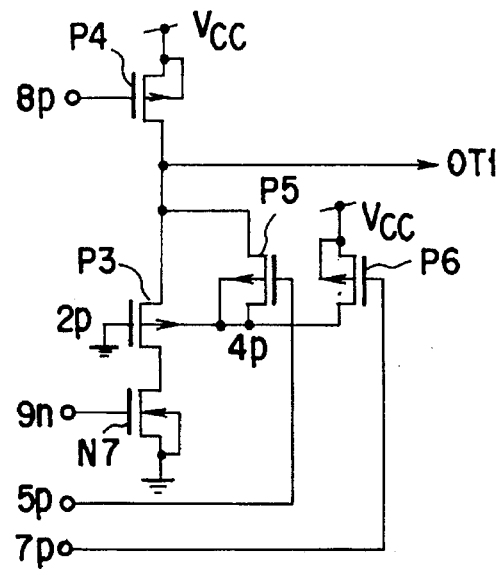
F I G. 33B
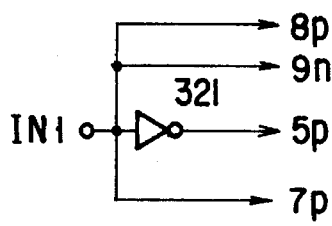
F I G. 34A
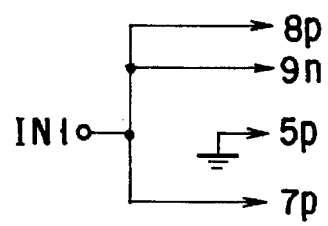
F I G. 34B
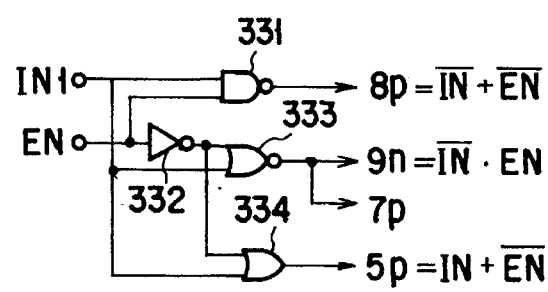
F I G. 35

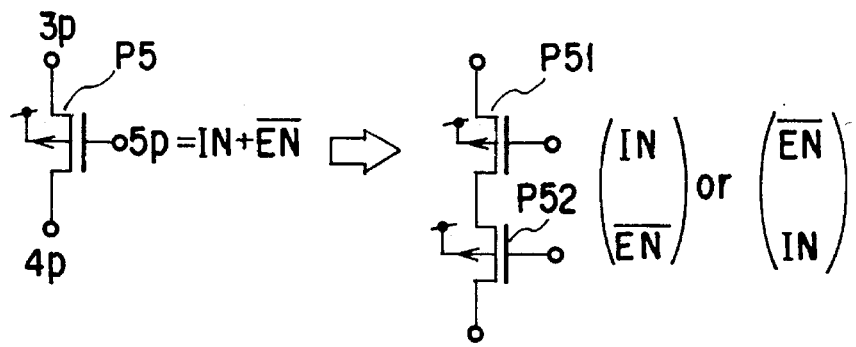
F I G. 36A
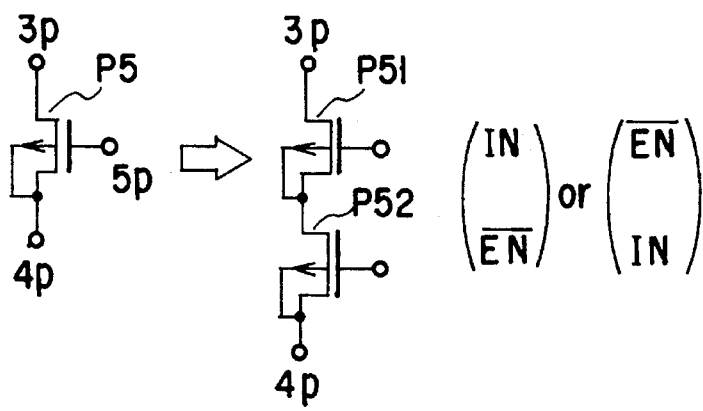
F I G. 36B
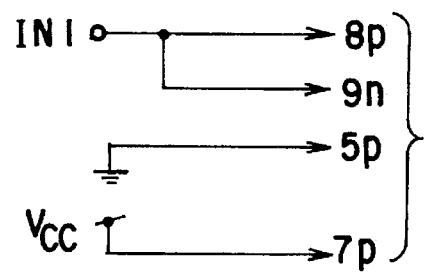
F I G. 37

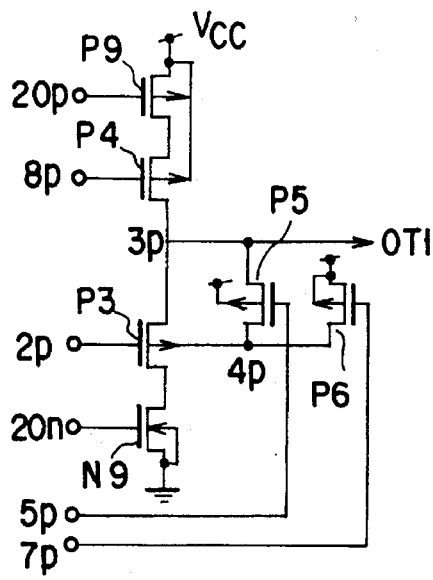
F I G. 38A
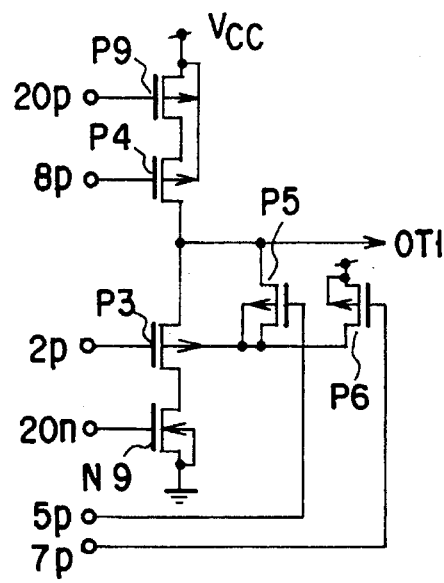
F I G. 38B
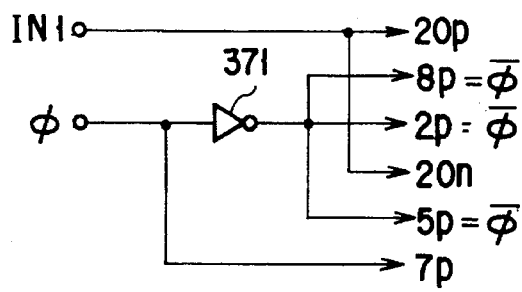
F I G. 39A
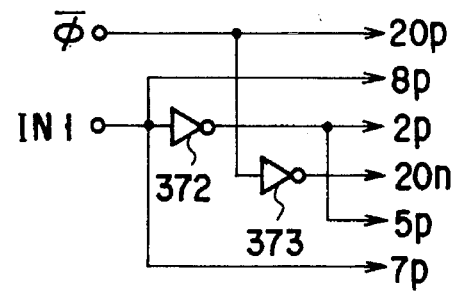
F I G. 39B
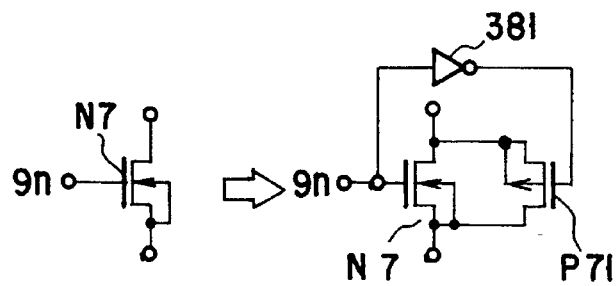
F I G. 40

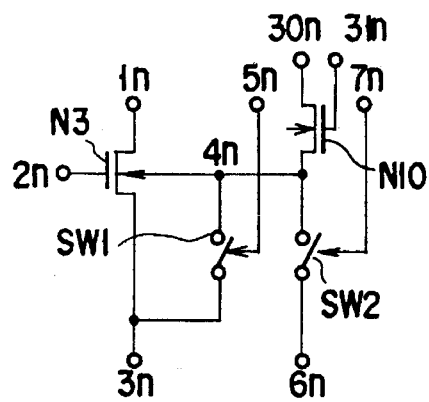
F I G. 44A
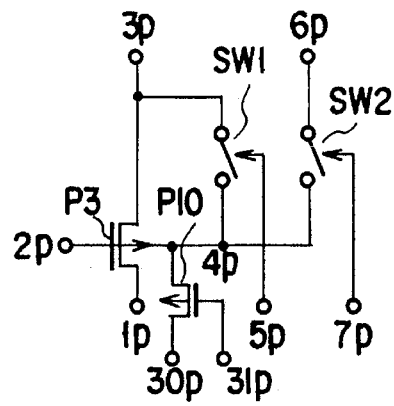
F I G. 44B
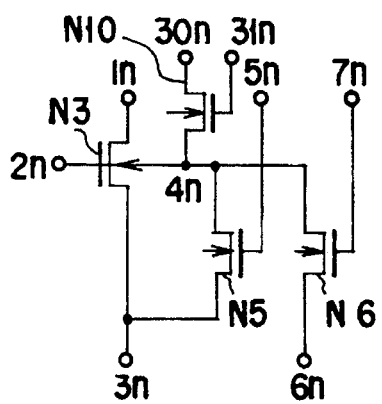
F I G. 45A
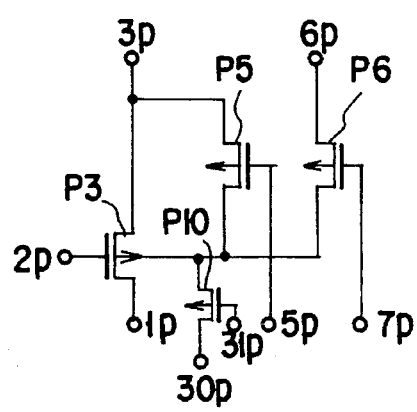
F I G. 45B
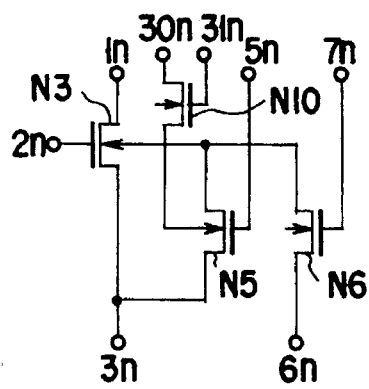
F I G. 46A
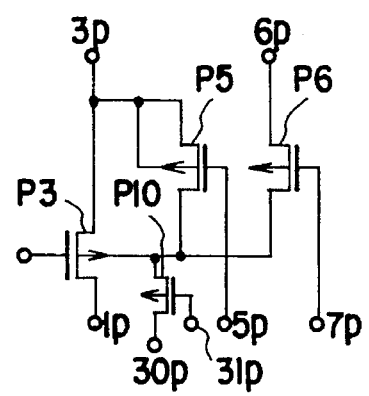
F I G. 46B ers CMOS OUTPUT CIRCUIT COMPENSATING
FOR BACK-GATE BIAS EFFECTS This application is a continuation of application Ser. No. 07/917,936, filed Jul. 24, 1992, now abandoned.

BACKGROUND OF THE INVENTION

1. Field of the Invention

The present invention relates to an output circuit including a MOS FET and, more particularly, to an output circuit in which a conductivity type of a diffusion layer connected to an output node is restricted to one of N type or P type.

2. Description of the Related Art

FIG. 1 shows a conventional output circuit for use in, for example, a clocked inverter circuit. Tri-state buffers 1 and 2 shown in FIG. 1 are constituted by, for example, CMOS circuits, with different power supply voltages Vcc1 and Vcc2 respectively being applied to the buffers 1 and 2. Output nodes of the tri-state buffers 1 and 2 are connected to a bus line 3. When the buffers 1 and 2 are constituted by CMOS circuits, P- and N-type diffusion layers are always connected to the output nodes of the CMOS circuits. Therefore, as shown in FIG. 1, a parasitic diode PD is produced between the output node and the power supply Vcc1. If the relationship between the power supply voltages Vcc1 and Vcc2 is expressed as follows, current flows from the power supply Vcc2 to the power supply Vcc1 through the parasitic diode PD.

Vcc1<Vcc2−1V

FIG. 2 shows another conventional output circuit, which includes N-channel MOS transistors N1 and N2 connected to an output node OT1. Since, however, a substrate (e.g., a P well), not shown, serving as a back gate of the MOS transistor N1 is connected to a ground, the threshold voltage vth of the MOS transistor N1 is considerably higher than normal, due to a back gate bias effect. Assuming that a power supply voltage Vcc is 4.5 V and a threshold voltage Vth is 1 V when a high-level signal is output from the output node OT1, the output signal drops by about 1 V, from the power supply voltage Vcc to about 2.5 V, due to the threshold voltage and also to the back gate bias effect. Taking into consideration irregularities in the threshold voltage Vth, the level of the output signal may be lower than the lowest level 2.4 V of an input signal of a TTL (transistor-transistor logic).

To resolve the above drawback, the gate potential of the MOS transistor N1 can be boosted. However, a booster circuit is required for this and the resultant circuit arrangement is complicated. Further, the substrate of the MOS transistor N1 can be connected to the source thereof. Since, however, the substrate is a P type, a parasitic diode is generated between the substrate and the drain (an N-type diffusion layer connected to the power supply Vcc) of the MOS transistor N1, thereby causing the above-described drawback. Consequently, in the conventional output circuit, the substrate of the MOS transistor N1 cannot be connected to the output node OT1.

SUMMARY OF THE INVENTION

The present invention has been developed in order to resolve the above drawback and its object is to provide an output circuit with a simple arrangement capable of outputting a voltage of a desired level even when the conductivity types of MOS transistors connected to an output node are the same.

According to one aspect of the present invention, an output circuit comprises:

first and second MOS transistors of the same conductivity type connected in series between first and second power supplies to form a current path, alternately turned on in response to an input signal;

an output terminal connected to a connection point of the first and second MOS transistors; and a third MOS transistor whose current path is connected to the output terminal at one end and connected to a back gate of the first MOS transistor at the other end.

A gate of the third MOS transistor is connected to a fixed potential and supplied with the input signal. A back gate of the third MOS transistor is connected to that of the first MOS transistor.

According to another aspect of the present invention, an output circuit comprises:

first and second MOS transistors of the same conductivity type connected in series between first and second power supplies to form a current path, and alternately turned on in response to an input signal;

an output terminal connected to a connection point of the first and second MOS transistors;

a third MOS transistor whose current path is connected at one end to the output terminal, and connected at the other end to a back gate; and a fourth MOS transistor whose current path is connected between the back gate of the first MOS transistor and a fixed potential, and turned on in response to the input signal.

A gate of the third MOS transistor is connected to the fixed potential and supplied with the input signal. A back gate of the third MOS transistor is connected to that of the first MOS transistor, and a back gate of the fourth MOS transistor is connected to the fixed potential.

According to still another aspect of the present invention, an output circuit comprises:

a first MOS transistor of a first conductivity type whose current path is connected at one end to a first potential and which is turned on in response to a first input signal;

a second MOS transistor of a second conductivity type having a current path one end of which is connected to the other end of the current path of the first MOS transistor and another end of which is connected to an output terminal, and having a gate connected to the first potential;

a third MOS transistor of the second conductivity type having a current path one end of which is connected to the output terminal and another end of which is connected to a second potential, the third MOS transistor being turned on in response to a second input signal;

a fourth MOS transistor of the second conductivity type having a current path one end of which is connected to a back gate of the second MOS transistor and another end of which is connected to the output terminal, the fourth MOS transistor being turned on in response to a third input signal; and a fifth MOS transistor of the second conductivity type having a current path one end of which is connected to the back gate of the second MOS transistor and another end of which is connected to the second potential, the fifth MOS transistor being turned on in response to a fourth input signal.

A back gate of the fourth transistor is connected to the second potential and the output terminal.

According to yet another aspect of the present invention, an output circuit comprises:

a first insulation gate MOS transistor having a current path one end of which is connected to a first potential and another end of which is connected to an output terminal, for applying a voltage to the output terminal in response to a first input signal;

a switching element having a current path one end of which is connected to the output terminal and another end of which is connected to a back gate of the first insulation gate MOS transistor, the switching element being turned on in response to a second input signal; and a second insulation gate MOS transistor having a current path one end of which is connected to a back gate of the first insulation gate MOS transistor and another end of which is connected to a second potential higher than the first potential, the second insulation gate MOS transistor causing the first insulation gate MOS transistor to perform a bipolar operation in response to the second input signal.

According to the output circuit described above, first and second MOS transistors of the same conductivity are connected in series between the first and second power supplies and are alternately turned on in response to the input signal, the output terminal is connected to the connection point of the first and second MOS transistors, and the third MOS transistor is arranged between the output terminal and back gate of the first MOS transistor and turned on at the fixed potential or in response to the input signal. Therefore, the back gate bias effect of the first MOS transistor can be mitigated and the output voltage enhanced.

Since the back gate of the third MOS transistor is connected to that of the first MOS transistor, the back gate bias effect of the third MOS transistor can be mitigated and the output voltage enhanced much more. Since the fourth MOS transistor, which is turned on in response to the input signal, is connected between the back gate of the first MOS transistor and the fixed potential, the first MOS transistor can be reliably turned off. Since the back gate of the fourth MOS transistor is connected to the fixed potential, the first MOS transistor can be turned off more reliably.

According to the output circuit described above, the first MOS transistor of the first conductivity type is turned on in response to the first input signal, the second MOS transistor of the second conductivity type is turned on by the first potential, and the third MOS transistor is turned on in response to the second input signal, and these three MOS transistors are connected in series between the first and second potentials, and the connection point of the second and third MOS transistors is connected to the output terminal. Since, in this output circuit, the fourth MOS transistor of the second conductivity type which is turned on in response to the third input signal and the fifth MOS transistor of the second conductivity type which is turned on in response to the fourth input signal, are connected to the back gate of the second MOS transistor, the second MOS transistor can be reliably turned off.

Furthermore, the second insulation gate transistor, which is turned on in response to the second input signal, is arranged between the back gate of the first insulation gate transistor, which is connected to the first potential and has an output terminal to which a voltage is applied in response to the first input signal, and the second potential which is higher than the first potential. Thus, a bipolar operation of the first insulation gate transistor can be performed at high speed. Lastly, the possibility of latch up can be lessened if a time period during which a bipolar transistor remains in the ON-state is not undesirably lengthened.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram of an output circuit according to a first embodiment of the present invention;

FIG. 4 is a circuit diagram of an output circuit according to a second embodiment of the present invention;

FIG. 5 is a circuit diagram of an output circuit according to a third embodiment of the present invention, which is a modification to the output circuit shown in FIG. 3;

FIG. 6 is a circuit diagram of an output circuit according to a fourth embodiment of the present invention, which is a modification to the output circuit shown in FIG. 4;

FIGS. 7A and 7B are circuit diagrams of basic concepts of the output circuits shown in FIGS. 3 and 4, respectively;

FIGS. 8A and 8B are circuit diagrams of output circuits in which a switching element shown in FIG. 7A is constituted by an N-channel MOS transistor;

FIGS. 9A and 9B are circuit diagrams of output circuits in which a switching elements shown in FIG. 7B is constituted by a P-channel MOS transistor;

FIGS. 13A and 13B are circuit diagrams of modifications to the output circuits shown in FIGS. 11A and 12A, respectively;

FIG. 14A is a circuit diagram of an input circuit for supplying a signal to inverting circuits corresponding to the output circuits shown in FIGS. 13A and 13B;

FIG. 14B is a circuit diagram of an input circuit for supplying a signal to non-inverting circuits corresponding to the output circuits shown in FIGS. 13A and 13B;

FIG. 15A is a circuit diagram of an input circuit for supplying a signal to inverting tri-state circuits corresponding to the output circuits shown in FIGS. 13A and 13B;

FIG. 15B is a circuit diagram of an input circuit for supplying a signal to non-inverting tri-state circuits corresponding to the output circuits shown in FIGS. 13A and 13B;

FIGS. 19A and 19B are circuit diagrams of modifications to the output circuits shown in FIGS. 13A and 13B;

FIG. 20A is a circuit diagram of an input circuit for supplying a signal to inverting circuits corresponding to the output circuits shown in FIGS. 19A and 19B;

FIG. 20 is a circuit diagram of an input circuit for supplying a signal to inverting circuits corresponding to the output circuits shown in FIGS. 19A and 19B;

FIG. 21 is a circuit diagram of an input circuit for supplying a signal to non-inverting tri-state circuits corresponding to the output circuits shown in FIGS. 19A and 19B;

FIG. 28A is a circuit diagram of an input circuit for supplying a signal to inverting circuits corresponding to the output circuits shown in FIGS. 27A and 27B;

FIG. 28B is a circuit diagram of an input circuit for supplying a signal to non-inverting circuits corresponding to the output circuits shown in FIGS. 27A and 27B;

FIG. 29A is a circuit diagram of an input circuit for supplying a signal to inverting tri-state circuits corresponding to the output circuits shown in FIGS. 27A and 27B;

FIG. 29B is a circuit diagram of an input circuit for supplying a signal to non-inverting tri-state circuits corresponding to the output circuits shown in FIGS. 27A and 27B;

FIG. 30A is a circuit diagram of an input circuit from which an AND circuit 272 shown in FIG. 29A is deleted;

FIG. 30B is a circuit diagram of an input circuit from which an AND circuit 276 shown in FIG. 29B is deleted;

FIG. 31 is a circuit diagram of another input circuit for supplying a signal to inverting tri-state circuits corresponding to the output circuits shown in FIGS. 27A and 27B;

FIG. 32 is a circuit diagram of an input circuit for supplying a signal to analog non-inverting circuits corresponding to the output circuits shown in FIGS. 27A and 27B;

FIGS. 33A and 33B are circuit diagrams of circuits in which the output circuits shown in FIGS. 19A and 19B are constituted by P-channel MOS transistors, respectively;

FIG. 34A is a circuit diagram of an input circuit for supplying a signal to inverting circuits corresponding to the circuits shown in FIGS. 33A and 33B;

FIG. 34B is a circuit diagram of an input circuit for supplying a signal to inverting circuits corresponding to the circuits shown in FIGS. 33A and 33B;

FIG. 3 is a circuit diagram of an input circuit for supplying a signal to non-inverting tri-state circuits corresponding to the circuits shown in FIGS. 33A and 33B;

FIGS. 36A and 36B are circuit diagrams of an input circuit from which an OR circuit 334 shown in FIG. 35 is removed;

FIG. 37 is a circuit diagram of an input circuit for supplying a signal to an analog inverting circuit corresponding to the circuits shown in FIGS. 33A and 33B;

FIGS. 38A and 38B are circuit diagrams of circuits for controlling the circuits shown in FIGS. 11B and 12B, respectively, in response to a clock signal;

FIGS. 39A and 39B are circuit diagrams of input circuits for controlling the circuits shown in FIGS. 38A and 38B in response to the clock signal;

FIG. 40 is a circuit diagram of a circuit for increasing the fall of an output voltage of the output circuits shown in FIGS. 33A and 33B;

FIGS. 44A and 44B are circuit diagrams of circuits in which the sources of the MOS transistors N10 and P10 are connected to the MOS transistors N3 and P3 shown in FIGS. 10A and 10B, respectively;

FIGS. 45A and 45B are circuit diagrams of circuits in which the sources of the MOS transistors N10 and P10 are connected to the substrates of the MOS transistors N3 and P3 shown in FIGS. 11A and 11B, respectively; and FIGS. 46A and 46B are circuit diagrams of circuits in which the sources of the MOS transistors N10 and P10 are connected to the substrates of the MOS transistors N3 and P3 shown in FIGS. 12A and 12B, respectively.

DETAILED DESCRIPTION OF THE PREFERRED EMBODIMENTS

Figure 1:
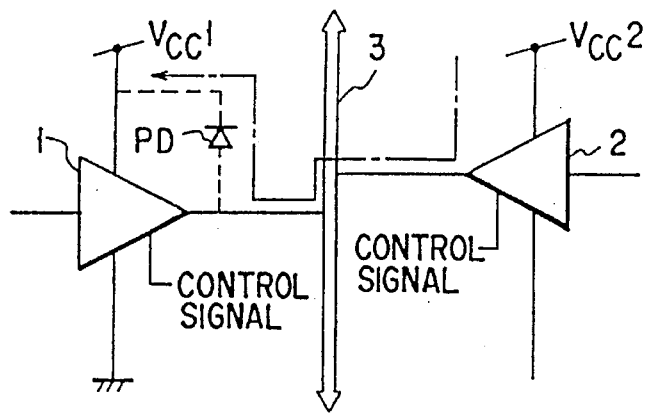
FIG. 1 is a circuit diagram of a conventional output circuit.
Figure 2:
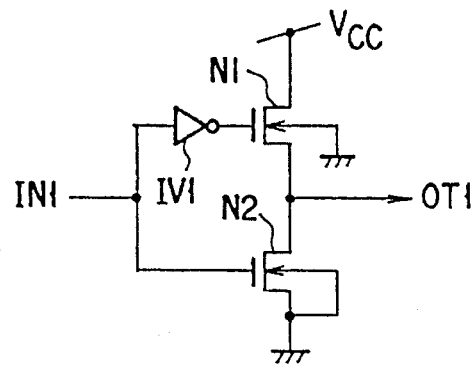
FIG. 2 is a circuit diagram of another conventional output circuit.

Embodiments of the present invention will now be described with reference the accompanying drawings.

FIG. 3 shows an output circuit according to the first embodiment of the present invention. In FIG. 3, N-channel MOS transistors N3 and N4 are connected in series between a power supply Vcc and a ground. The drain of the MOS transistor N3 is connected to the power supply Vcc, and the source thereof is connected to both an output node OT1 and the drain of the MOS transistor N4. The source of the MOS transistor N4 is grounded and the gate thereof is connected to an input node IN1. The input node IN1 is connected to the gate of the MOS transistor N3 via an inverter circuit IV1. The drain of an N-channel MOS transistor N5 is connected to the output node OT1, and the source thereof is connected to a substrate serving as a back gate of the MOS transistor N3. The gate of the MOS transistor N5 is connected to the power supply Vcc. A substrate serving as a back gate of the MOS transistor N4 is connected to, e.g., a P well at a ground potential.

In the above circuit arrangement, the potential of the source of the MOS transistor N5 becomes the ground potential when the output node OT1 is at the ground potential and increases as the potential of the output node OT1 increases. However, both the potentials are not equalized to each other because of a back gate bias effect, and the potential of the source of the MOS transistor N5 is slightly lower than that of the output node OT1.

When the potential of the input node IN1 is equal to the power supply voltage Vcc, the MOS transistor N4 is turned on and the MOS transistor N3 is turned off, and thus the output node OT1 is set at the ground potential when the potential of the input node IN1 is equal to the ground potential, the MOS transistor N4 is turned off and the MOS transistor N3 is turned on. The potential of the output node OT1 then increases in spite of the back gate bias effect of the MOS transistor N3 on the initial stage. Since, therefore, the potential of the source of the MOS transistor N5 increases and the back gate bias effect is reduced, the potential of the output node OT1 increases further, and the potential of the source of the MOS transistor N5 increases again. This operation is repeated to keep a balance between the potentials of the output node OT1 and the source of the MOS transistor N5, and the potential of the output node OT1 stops increasing.

In the first embodiment, the potential of the source of the MOS transistor N5 increases in accordance with the potential of the output node OT1, and the back gate bias effect of the MOS transistor N3 is reduced, with the result that the potential of the output node OT1 is made higher than that of the output node of the conventional output circuit.

When the potential of the output node OT1 is increased higher than the power supply voltage Vcc, the potential of the source of the MOS transistor N5 is not determined by the potential of the output node OT1 but by Vcc–Vthn (Vthn is a threshold voltage of the MOS transistor N5). Since, therefore, a parasitic diode generated between the source of the MOS transistor N5 and the drain of the MOS transistor N3 is not turned on, no current flows through the parasitic diode as in the conventional output circuit.

A well-known SPICE simulation is performed in the output circuit shown in FIG. 3. As a result, when the power supply voltage Vcc=4.5 V, the potential of the output node OT1 is 3.4 V on condition that Vthn indicates the middle value of dispersion.

The threshold voltage of a CMOS circuit is generally 2.25 V. Taking into consideration a margin for the threshold voltage, it is desirable that the voltage of an input signal is Vcc×0.7 or more. If Vcc=4.5 V, the input signal needs to have a voltage of 3.15 V or more. The first embodiment of the present invention is able to satisfy the condition for the voltage of the input signal.

FIG. 4 shows an output circuit according to the second embodiment of the present invention. In FIG. 4, a P well (back gate) of the MOS transistor N5 is connected to the source thereof and, in this case, the back gate bias effect of the MOS transistor N5 is reduced. Therefore, the potential of the output node OT1 is increased higher than that of the output node OT1 shown in FIG. 3.

A SPICE simulation is carried out in the output circuit shown in FIG. 4 on the same condition as that of the SPICE simulation in the circuit shown in FIG. 3, with the result that the potential of the output node OT1 is 3.65 V, and the back gate bias effect is suppressed more than that of the circuit shown in FIG. 3.

FIG. 5 shows an output circuit according to the third embodiment of the present invention, which is a modification to the output circuit shown in FIG. 3. In the output circuit in FIG. 5, the MOS transistor N3 can be reliably turned off when the source of the transistor N5 is set at the ground potential. In FIG. 5, the same elements as those in FIG. 3 are denoted by the same reference numerals and their descriptions are omitted.

In the output circuit shown in FIG. 5, the gate of the transistor N5 is connected to that of the transistor N3, the source of the MOS transistor N5 is connected to the drain of an N-channel MOS transistor N6, the source of the MOS transistor N6 is grounded, and the gate of the MOS transistor N6 is connected to the input node IN1.

When the MOS transistor N3 shown in FIG. 3 is turned off, the potential of the output node OT1 is lower than that of the source of the MOS transistor N5, and the MOS transistor N3 performs a bipolar operation, with the result that it is hard to turn off. In the circuit shown in FIG. 5, when the level of the input node IN1 becomes high, the MOS transistor N6 is turned on and the source of the MOS transistor N5 is set at the ground potential. Thus, the MOS transistor N3 can reliably be turned off.

FIG. 6 shows an output circuit according to the fourth embodiment of the present invention, which is a modification to the output circuit shown in FIG. 4. The output circuit of FIG. 6 allows the MOS transistor N3 to be reliably turned off and is substantially the same as that of FIG. 5. The same elements as those in FIGS. 4 and 5 are indicated by the same reference numerals, and their descriptions are omitted.

FIGS. 7A and 7B show basic concepts of the output circuits shown in FIGS. 3 and 4, respectively. The relationship between the MOS transistors N3 and N5 is not limited to the circuits shown in FIGS. 3 and 4. In other words, the MOS transistor N5 can be replaced with a switching element SW as shown in FIG. 7A. Further, the switching element SW can include a resistive component, and a depletion type transistor can be employed in which its conduction depends upon a change in conductive resistance.

The relationship in potential between nodes 3n and 4n of the MOS transistor N3 can be a function of the voltage applied to a control signal input node 5n of the switching element SW. For example, when the switching element SW is an N-channel MOS transistor, the voltage V4n of the node 4n is set so as not to increase not lower than V5n–Vthn (V5n is a voltage of the node 5n).

The MOS transistor N3 is not limited to the N-channel MOS transistor, and a P-channel MOS transistor can be used in place of the MOS transistor N3. The node 3p is then used when the node 3p is always at the high potential.

Figure 10A:
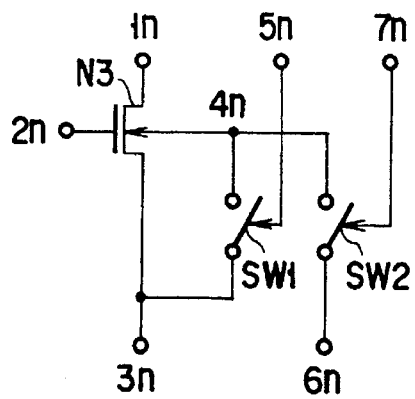
FIGS. 10A and 10B are circuit diagrams of basic concepts of the output circuits shown in FIGS. 5 and 6, respectively.
Figure 10B:
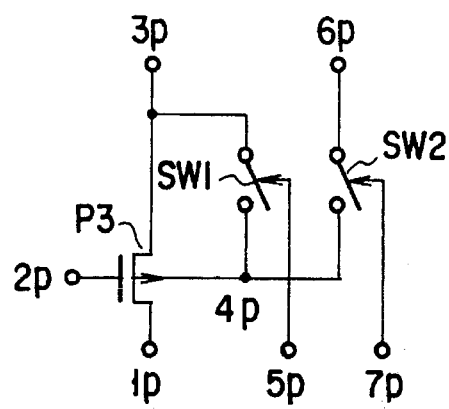

FIGS. 8A and 8B show output circuits in which a switching element shown in FIG. 7A is constituted by an N-channel MOS transistor. FIGS. 9A and 9B show output circuits in which a switching element shown in FIG. 7B is constituted by a P-channel MOS transistor. FIGS. 10A and 10B show basic concepts of the output circuits shown in FIGS. 5 and 6, respectively.

The relationship between the MOS transistors N5 and N6 is not limited to the circuits shown in FIGS. 5 and 6. Basically, the MOS transistors N5 and N6 can be replaced with switching elements SW1 and SW2 as shown in FIG. 10A and, in this case, the potential of node 6n of the switching element SW2 has only to be equal to or lower than that of node 3n of the switching element SW1. Further, the switching elements SW1 and SW2 can include resistive elements, and a depletion type transistor can be employed in which its conduction depends upon a change in conductive resistance. The potentials of the control signal input nodes 5n and 7n of the switching elements SW1 and SW2 are not limited. It is desirable that the node 7n controls the potential of the node 4n of the MOS transistor N3 so that it does not exceed a sum of the potential of the node 3n and VF. VF indicates a potential of a junction diode formed of the nodes 3n (N type) and 4n (P type) of the MOS transistor N3.

The MOS transistor N3 is not limited to an N-channel type, but can be replaced with a P-channel MOS transistor P3 as shown in FIG. 10B. If the P-channel MOS transistor P3 is used, the node 3p is always set at a high potential.

Figure 11A:
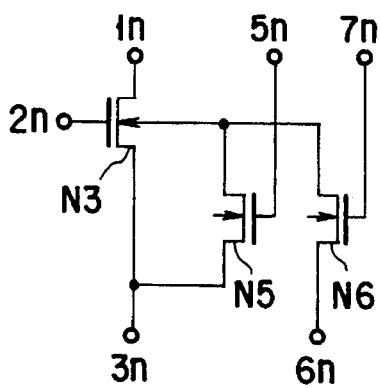
FIG. 11A is a circuit diagram of an output circuit in which switching elements SW1 and SW2 shown in FIG. 10A are constituted of N-channel MOS transistors N5 and N6, respectively.
Figure 11B:
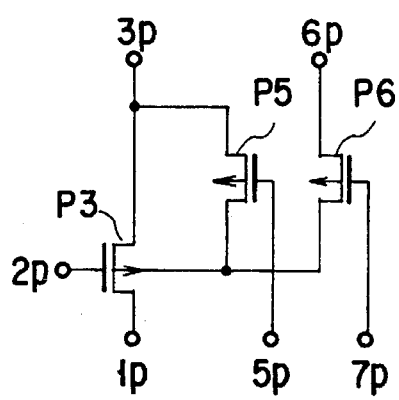
FIG. 11B is a circuit diagram of an output circuit in which switching elements SW1 and SW2 shown in FIG. 10B are constituted of P-channel MOS transistors P5 and P6, respectively.

FIG. 11A shows an output circuit including N-channel MOS transistors N5 and N6 which are substituted for the switching elements SW1 and SW2 shown in FIG. 10A, and FIG. 11B shows an output circuit including P-channel MOS transistors P5 and P6 which are substituted for the switching elements SW1 and SW2 shown in FIG. 10B.

Figure 12A:
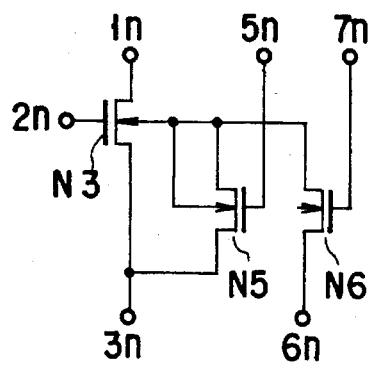
FIGS. 12A and 12B are circuit diagrams of output circuits which are arranged by modifying the output circuits shown in FIGS. 11A and 11B, respectively, in accordance with the output circuit shown in FIG. 6.
Figure 12B:
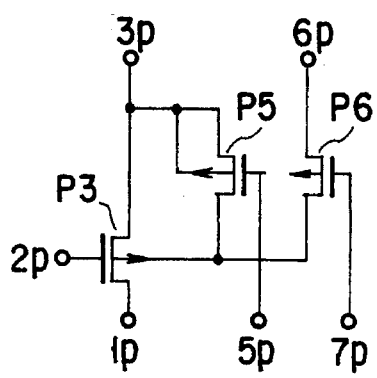

FIGS. 12A and 12B show output circuits which are arranged by modifying the output circuits shown in FIGS. 11A and 11B, respectively, in accordance with the output circuit shown in FIG. 6. In the output circuit shown in FIG. 12A, a P well (back gate) of the MOS transistor N5 is connected to the source thereof. In the output circuit shown in FIG. 12B, an N well (back gate) of the MOS transistor P5 is connected to the source thereof.

FIGS. 13A and 13B show modifications to the output circuits shown in FIGS. 11A and 12A, respectively, and the circuits shown in FIGS. 13A and 13B serve as inverting circuits or non-inverting circuits in response to signals supplied to the nodes 2n, 5n, 7n and 8n.

FIG. 14A shows an input circuit for supplying a signal to inverting circuits corresponding to the output circuits shown in FIGS. 13A and 13B. In this input circuit, an input node IN1 is connected to nodes 7n and 8n, and also connected to nodes 2n and 5n via an inverter circuit 121. Thus, a signal input from the input node IN1 is inverted and output from the output node OT1 of the circuits shown in FIGS. 13A and 13B.

FIG. 14B shows an input circuit for supplying a signal to non-inverting circuits corresponding to the output circuits shown in FIGS. 13A and 13B. In this input circuit, an input node IN1 is connected to nodes 7n and 8n via an inverter circuit 122. Therefore, a signal input from the input node IN1 is not inverted but output from the output node OT1 of the circuits shown in FIGS. 13A and 13B.

FIG. 15A shows an input circuit for supplying a signal to inverting tri-state circuits corresponding to the output circuits shown in FIGS. 13A and 13B. In this input circuit, an input node IN1 and an enable signal input node $\overline{EN}$ are connected to both an input node of an OR circuit 131 and that of a NOR circuit 132. An output node of the OR circuit 131 is connected to a node 7n, and an output node of the NOR circuit 132 is connected to nodes 2n and 5n. The output node of the NOR circuit 132 and the enable signal input node $\overline{EN}$ are connected to the input node of the input node of the NOR circuit 133, and the output node of the NOR circuit 133 is connected to the node 8n.

FIG. 15B show an input circuit for supplying a signal to non-inverting tri-state circuits corresponding to the output circuits shown in FIGS. 13A and 13B. In this input circuit, both an input node IN1 and an enable signal input node $\overline{EN}$ are connected an input node of the NOR circuit 134. The output node of the NOR circuit 134 is connected to the node 8. Both the output node of the NOR circuit 134 and the enable signal input node $\overline{EN}$ are connected to input nodes of the OR circuit 135 and NOR circuit 136. The output node of the OR circuit 135 is connected to the node 7n, and the output node of the NOR circuit 136 is connected to nodes 2n and 5n.

Figure 16A:
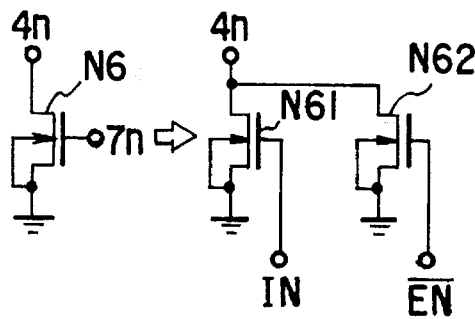
FIG. 16A is a circuit diagram of an input circuit from which an OR circuit 131 shown in FIG. 15A is removed.

FIG. 16A shows an input circuit from which an OR circuit 131 shown in FIG. 15A is removed. As shown in FIG. 16A, MOS transistors N61 and N62, which correspond to the MOS transistor shown in FIGS. 13A and 13B, are connected in parallel to each other, and the gates of the MOS transistors N61 and N62 are connected to an input node IN1 and an enable signal input node $\overline{EN}$, respectively. Consequently, if the MOS transistor N6 shown in FIGS. 13A and 13B is arranged as shown in FIG. 16A, the OR circuit 131 shown in FIG. 15A can be removed.

Figure 16B:
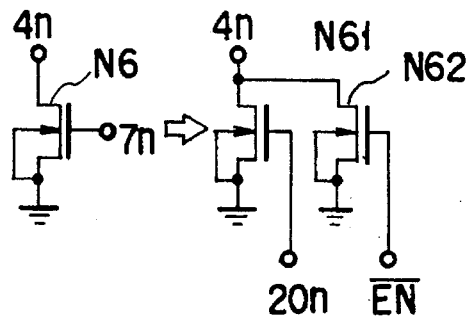
FIG. 16B is a circuit diagram of an input circuit from which an OR circuit 135 shown in FIG. 15B is removed.

FIG. 16B shows an input circuit from which an OR circuit 135 shown in FIG. 15B is removed. As shown in FIG. 16B, the MOS transistors N61 and N62, which correspond to the MOS transistor shown in FIGS. 13A and 13B, are connected in parallel to each other, and the gates of the MOS transistors N61 and N62 are connected to an output node 20n of the NOR circuit 134 shown in FIG. 15B and enable signal input node $\overline{EN}$, respectively. Consequently, if the MOS transistor N6 shown in FIGS. 13A and 13B is arranged as shown in FIG. 16B, the OR circuit 135 shown in FIG. 15B can be removed.

Figure 17:
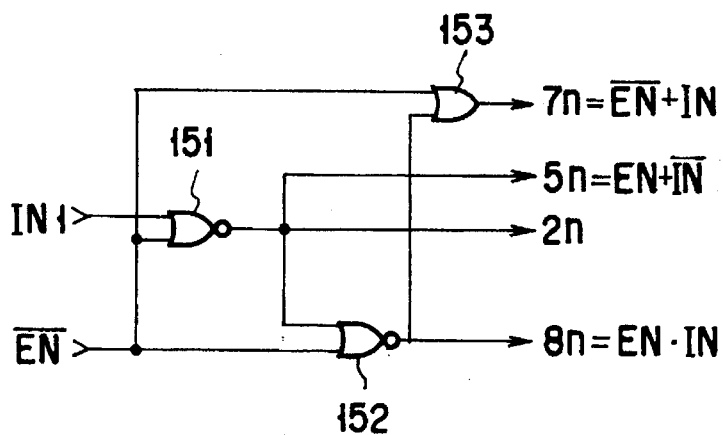
FIG. 17 is a circuit diagram of another input circuit for supplying a signal to inverting tri-state circuits corresponding to the output circuits shown in FIGS. 13A and 13B.

FIG. 17 shows another input circuit for supplying a signal to non-inverting tri-state circuits corresponding to the output circuits shown in FIGS. 13A and 13B. Both an input node IN1 and an enable signal input node $\overline{EN}$ are connected to the input node of a NOR circuit 151. The output node of the NOR circuit 151 is connected to nodes 2n and 5n. The output node of the NOR circuit 151 and the enable signal input node $\overline{EN}$ are connected to the input node of a NOR circuit 152. The output node of the NOR circuit 152 and the enable signal input node $\overline{EN}$ are connected to the input node of an OR circuit 153. The output node of the OR circuit 153 is connected to a node 7n, and that of the NOR circuit 152 is connected to a node 8n.

Figure 18:
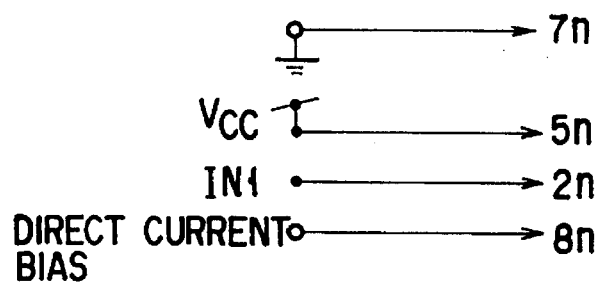
FIG. 18 is a circuit diagram of an input circuit for supplying a signal to analog non-inverting circuits corresponding to the output circuits shown in FIGS. 13A and 13B.

FIG. 18 shows an input circuit for supplying a signal to analog non-inverting circuits, for example, corresponding to the output circuits shown in FIGS. 13A and 13B. In this input circuit, the node 7n is grounded, the node 5n is connected to the power supply Vcc, the node 2n is connected to the input node IN1, and the node 8n is connected to a current bias so that the MOS transistor N4 can serve as a constant current source.

FIGS. 19A and 19B show modifications to the output circuits shown in FIGS. 13A and 13B. In FIGS. 19A and 19B, the same elements as those in FIGS. 13A and 13B are denoted by the same reference numerals.

In the circuits shown in FIGS. 19A and 19B, the gate of the MOS transistor N3 is connected to the power supply Vcc and, in this state, the circuits function as inverting circuits or non-inverting circuits in accordance with the relationships among the nodes 7n, 5n, 9p, and 8n. The drain of a P-channel MOS transistor P7 is connected to the drain of the MOS transistor N3. The substrate (back gate) of the MOS transistor P7 and the source thereof are connected to the power supply Vcc. The gate of the MOS transistor P7 is connected to a node 9p.

In the circuits shown in FIGS. 19A and 19B, when the MOS transistor is a depletion type, a high voltage is generated from the output node OT1. Since the P-channel MOS transistor is connected in series to the MOS transistor N3, no direct through current flows into the MOS transistor N3. The amplitude of the voltage generated from the output node OT1 can be suppressed by increasing the threshold voltage of the MOS transistor N3 or that of the MOS transistor N5, or by decreasing the potential of the node 5n.

FIG. 20A shows an input circuit for supplying a signal to inverting circuits corresponding to the circuits shown in FIGS. 19A and 19B. In this input circuit, the input node IN1 is connected to the nodes 7n, 8n and 9p, and also connected to the node 5n via an inverter circuit 181.

FIG. 20B shows an input circuit for supplying a signal to inverting circuits corresponding to the circuits shown in FIGS. 19A and 19B. In this input circuit, the node 5n is connected to the power supply Vcc, and the nodes 7n, 8n and 9p are connected to the input node IN1.

FIG. 21 shows an input circuit for supplying a signal to non-inverting tri-state circuits corresponding to the circuits shown in FIGS. 19A and 19B. The input node IN1 and enable signal input node EN are connected to both the input node of an AND circuit 191 and that of a NAND circuit 192. The output node of the AND circuit 191 is connected to the node 5n, and that of the NAND circuit 192 is connected to the nodes 9p and 7n. Further, the enable signal input node EN is connected to one end of the input node of a NOR circuit 194 via an inverter circuit 193, and the input node IN1 is connected to the other end of the input node of the NOR circuit 194. The output node of the NOR circuit 194 is connected to the node 8n.

Figure 22A:
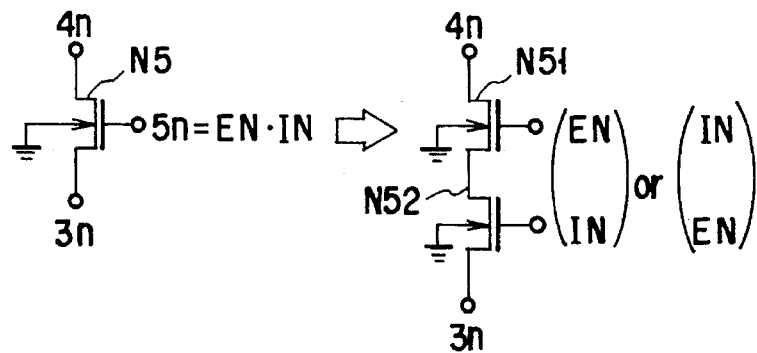
FIGS. 22A and 22B are circuit diagrams of input circuits from which an AND circuit 191 shown in FIG. 21 is removed.
Figure 22B:
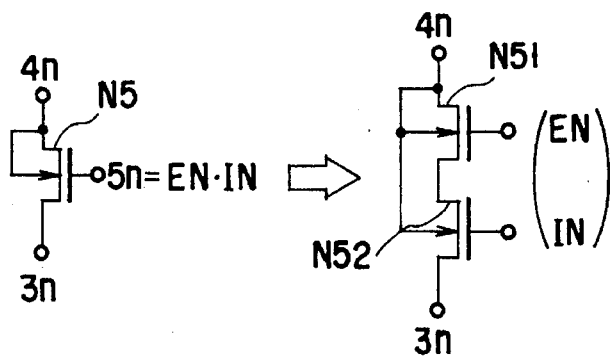

FIGS. 22A and 22B show input circuits from which the AND circuit 191 shown in FIG. 21 is removed.

In the input circuit shown in FIG. 22A, a series circuit of MOS transistors N51 and N52 is used in place of the MOS transistor N5 shown in FIG. 19A, the gate of the MOS transistor N51 is connected to the enable signal input node EN, and the gate of the MOS transistor N52 is connected to the input node IN.

In the input circuit shown in FIG. 22B, a series circuit of MOS transistors N51 and N52 is used in place of the MOS transistor N5 shown in FIG. 19B, the gate of the MOS transistor N51 is connected to the enable signal input node EN, and the gate of the MOS transistor N52 is connected to the input node IN. Furthermore, P wells of the MOS transistors N51 and N52 are connected to the source of the MOS transistor N51 and, in this case, the P well of the MOS transistor N52 can be connected to the source of the MOS transistor N52. Consequently, if the circuits shown in FIGS. 19A and 19B are arranged as shown in FIGS. 19A and 19B, the AND circuit 191 shown in FIG. 21 can be removed.

Figure 23:
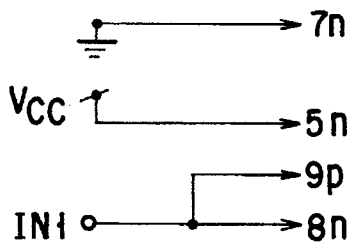
FIG. 23 is a circuit diagram of an input circuit for supplying a signal to analog inverting circuits corresponding to the output circuits shown in FIGS. 19A and 19B.

FIG. 23 shows an input circuit for supplying a signal to analog inverting circuits, e.g., amplifiers corresponding to the circuits shown in FIGS. 19A and 19B. In this input circuit, the node 7n is grounded, and the node 5n is connected to the power supply Vcc. The nodes 8n and 9p are connected to the input node IN1. A direct bias can be applied to the node 8n so that the MOS transistor N4 can serve as a constant current source.

Figure 24:
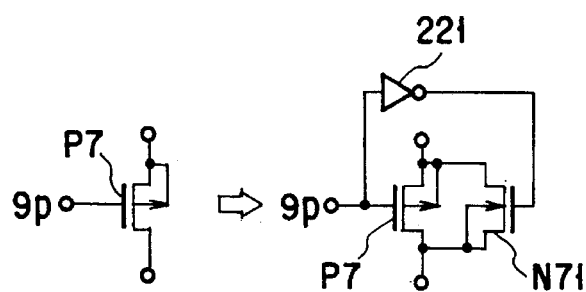
FIG. 24 is a circuit diagram of part of the output circuits shown in FIGS. 19A and 19B, for increasing the rise time of output voltage of an output node OT1.

FIG. 24 shows part of the output circuits shown in FIGS. 19A and 19B, for increasing the rise of the output voltage of the output node OT1. In the circuit shown in FIG. 24, an N-channel MOS transistor N71 is connected in parallel to the P-channel MOS transistor P7 shown in FIGS. 19A and 19B, and the substrate of the MOS transistor N71 is connected to the source thereof. The gate of the MOS transistor P7 connected to the node 9p is connected to the gate of the MOS transistor N71 via an inverter circuit 221. With this circuit arrangement, the rise of the output voltage of the output node OT1 can be increased.

Figure 25A:
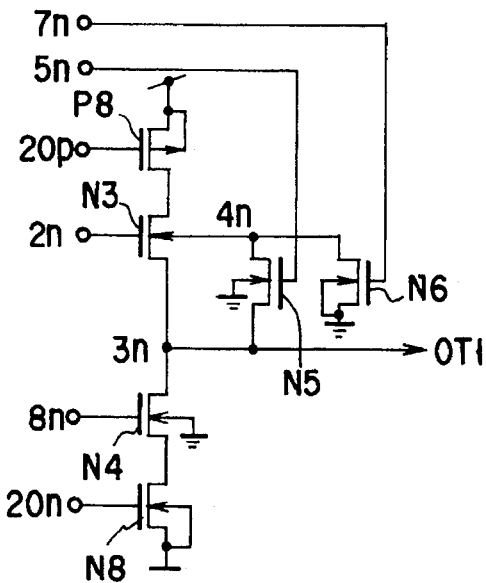
FIGS. 25A and 25B are circuit diagrams of circuits for controlling the output circuits shown in FIGS. 11A and 12A, respectively, in response to a clock signal.
Figure 25B:
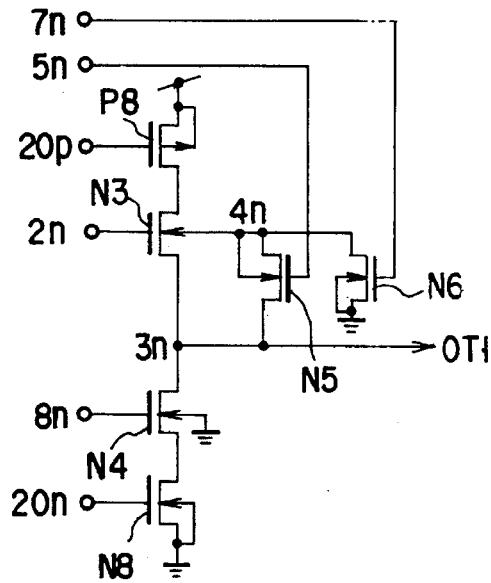

FIGS. 25A and 25B show circuits for controlling the output circuits shown in FIGS. 11A and 12A in response to a clock signal. In the circuits shown in FIGS. 25A and 25B, the drain of a P-channel MOS transistor P8 is connected to the drain of the MOS transistor N3. The substrate (back gate) and the source of the MOS transistor P8 are connected to the power supply Vcc. The gate of the MOS transistor P8 is connected to a node 20p. The drain of an N-channel MOS transistor N8 is connected to the source of the MOS transistor N4. A P well of the MOS transistor N8 is connected to the source, and the gate of the MOS transistor N8 is connected to the node 20.

Figure 26A:
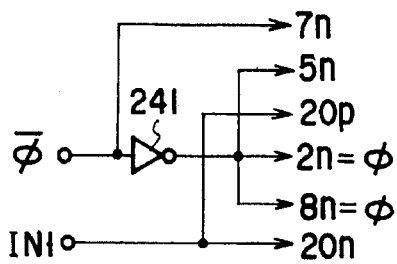
FIGS. 26A and 26B are circuit diagrams of input circuits for controlling the circuits shown in FIGS. 25A and 25B, respectively, in response to the clock signal.
Figure 26B:
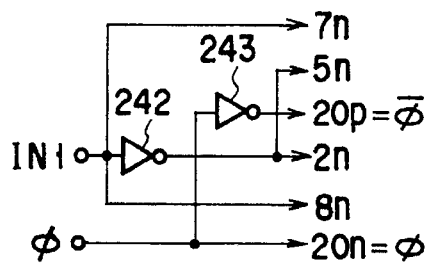

FIGS. 26A and 26B show input circuits for controlling the circuits shown in FIGS. 25A and 25B in response to a clock signal.

In the input circuit shown in FIG. 26A, the input node IN1 is connected to the nodes 20p and 20n. A clock signal input node $\bar{\phi}$ ($\bar{\phi}$ represents an inversion) is connected to the node 7n and also connected to the nodes 2n, 5n and 8n through an inverter circuit 241. If, therefore, clock signals are supplied to the nodes 2n and 8n of the MOS transistors N3 and N4, and input signals are supplied to the MOS transistors P8 and N8, the circuit is not caused to malfunction due to a difference in phase between clock signal $\phi$ and clock signal input node $\bar{\phi}$.

In the input circuit shown in FIG. 26B, the input node IN1 is connected to the nodes 7n and 8n and also connected to the nodes 2n and 5n through an inverter circuit 242. The clock signal input node $\phi$ is connected to the node 20n and connected to the node 20p through an inverter circuit 243.

If the MOS transistors N4 and N8 are removed from each of the circuits shown in FIGS. 25A and 25B, an open drain type clocked pull-up circuit can be obtained.

Figure 27A:
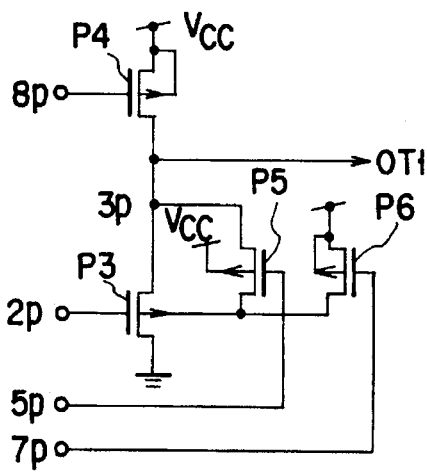
FIGS. 27A and 27B are circuit diagrams of output circuits in which the circuits shown in FIGS. 13A and 13B are constituted by P-channel MOS transistors, respectively.
Figure 27B:
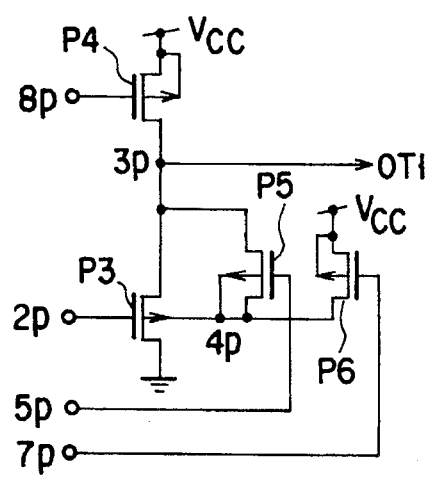

FIGS. 27A and 27B show output circuits in which the N-channel MOS transistors shown in FIGS. 13A and 13B are replaced with P-channel MOS transistors. The output circuits serve as inverting circuits or non-inverting circuits in response to signals supplied to the nodes 2p, 5p, 7p and 8p.

In the circuit shown in FIG. 27A, a current path of the P-channel MOS transistors P4 and P3 is connected in series between the power supply Vcc and the ground. The substrate of the MOS transistor P4 is connected to the source thereof, and the gate and node 8n of the MOS transistor P4 are connected to the node 8n and output node OT1, respectively. The gate of the MOS transistor P3 is connected to the node 2p, and the source of the MOS transistor P3 is connected to that of the P-channel MOS transistor P5. The substrate of the MOS transistor P5 is connected to the power supply Vcc, and the gate thereof is connected to the node 5p. The drain of the MOS transistor P5 is connected to the substrate of the MOS transistor P3 and the drain of the P-channel MOS transistor P6. The source and substrate of the MOS transistor P6 are connected to the power supply Vcc, and the gate thereof is connected to the node 7p.

FIG. 27B shows a circuit similar to the circuit shown in FIG. 27A but differs from it in that the substrate of the MOS transistor P5 is not connected to the power supply Vcc but the drain thereof. In the circuits shown in FIGS. 27A and 27B, if the MOS transistor P3 is a depletion type, an output voltage of a lower level can be produced. In this case, however, a through current is generated. The circuits shown in FIGS. 27A and 27B serve as inverting circuits or non-inverting circuits in response to signals supplied to the nodes 8p, 2p, 5p and 7p.

FIG. 28A shows an input circuit for supplying a signal to inverting circuits corresponding to the circuits shown in FIGS. 27A and 27B. In this input circuit, the input node IN1 is connected to the nodes 8p and 7p and also connected to the nodes 2p and 5p via an inverter circuit 261. Therefore, the signal input from the input node IN1 is inverted and output from the output node OT1 of the circuits shown in FIGS. 27A and 27B.

FIG. 28B shows an input circuit for supplying a signal to non-inverting circuits corresponding to the circuits shown in FIGS. 27A and 27B. In this input circuit, the input node IN1 is connected to the nodes 2p and 5p and also connected to the nodes 7p and 8p via an inverter circuit 262. Therefore, the signal input from the input node IN1 is not inverted but output from the output node OT1 of the circuits shown in FIGS. 27A and 27B.

FIG. 29A shows an input circuit for supplying a signal to inverting tri-state circuits corresponding to the circuits shown in FIGS. 27A and 27B. In this input circuit, both the input node IN1 and the enable signal input node EN are connected to the input node of a NAND circuit 271 and that of an AND circuit 272. The output node of the AND circuit 272 is connected to the node 7p, and that of the NAND circuit 271 is connected to the nodes 5p and 2p. The output node of the NAND circuit 271 is connected to the enable signal input node EN and the input node of a NAND circuit 273. The output node of the NAND circuit 273 is connected to the node 8p.

FIG. 29B shows an input circuit for supplying a signal to non-inverting tri-state circuits corresponding to the circuits shown in FIGS. 27A and 27B. In this input circuit, the input node IN1 and the enable signal input node EN are connected to an input node of a NAND circuit 274. The output node of the NAND circuit 274 is connected to the node 8p. Both the output node of the NAND circuit 274 and the enable signal input node EN are connected to the input nodes of a NAND circuit 275 and an AND circuit 276. The output node of the AND circuit 276 is connected to the node 7p, and the output node of the NAND circuit 275 is connected to the nodes 5p and 2p.

FIG. 30A shows an input circuit from which the AND circuit shown in FIG. 29A. In this input circuit, the MOS transistor P6 shown in FIGS. 27A and 27B is replaced with MOS transistors P61 and P62 which are connected in parallel to each other, and the gates of the MOS transistors P61 and P62 are connected to the enable signal input node EN and the input node IN1, respectively.

FIG. 30B shows an input circuit from which the AND circuit 276 shown in FIG. 29B is removed. In this input circuit, the MOS transistor P6 shown in FIGS. 27A and 27B is replaced with MOS transistors P61 and P62 which are connected in parallel to each other, and the gates of the MOS transistors P61 and P62 are connected to the enable signal input node EN and the output node of the NAND circuit 274 shown in FIG. 29B, respectively. If the circuits shown in FIGS. 27A and 27B are modified as shown in FIG. 30B, the AND circuit 276 shown in FIG. 29B can be removed.

FIG. 31 shows another input circuit for supplying a signal to inverting tri-state circuits corresponding to the circuits shown in FIGS. 27A and 27B. In this input circuit, both the input node IN1 and the enable signal input node EN are connected to the input node of a NAND circuit 291. Both the output node of the NAND circuit 291 and the enable signal input node EN are connected to the input node of a NAND circuit 292. The output node of the NAND circuit is connected to the node 8p, and also connected to the input node of an AND circuit, together with the enable signal input node EN. The output node of the AND circuit 293 is connected to the node 7p.

FIG. 32 shows an input circuit for supplying a signal to analog non-inverting circuits, for example, amplifiers corresponding to the circuits shown in FIGS. 27A and 27B. In this input circuit, the node 7p is connected to the power supply Vcc, and the node 5p is grounded. The node 2p is connected to the input node IN1, and the node 8p is connected to the direct current bias so that the MOS transistor P4 can serve as a constant current source.

FIGS. 33A and 33B show circuits in which the output circuits shown in FIGS. 19A and 19B are constituted by P-channel MOS transistors. The circuits shown in FIGS. 33A and 33B are modifications to the output circuits shown in FIGS. 27A and 27B. In FIGS. 33A and 33B, the same elements as those in FIGS. 27A and 27B are denoted by the same reference numerals.

The circuits shown in FIGS. 33A and 33B serve as inverting circuits or non-inverting circuits based on the relationship among the nodes 7p, 5p, 9n, and 8p when the gate of the MOS transistor P3 is grounded. More specifically, the gate of the MOS transistor P3 is grounded, and the drain of the N-channel MOS transistor N7 is connected to the drain of the MOS transistor P3. The P well of the MOS transistor N7, together with the source thereof, is grounded. The gate of the MOS transistor N7 is connected to the node 9n.

If the MOS transistor P3 is a depletion type in the circuits shown in FIGS. 33A and 33B, a voltage of a lower level is generated from the output node OT1. Since the MOS transistor N7 is connected in series to the MOS transistor P3, no direct through current flows into the MOS transistor P3. The amplitude of the voltage generated from the output node OT1 can be suppressed by increasing the threshold voltage of the MOS transistor P3 or that of the MOS transistor P5, or by heightening the potential of the node 5p.

FIG. 34A shows an input circuit for supplying a signal to inverting circuits corresponding to the circuits shown in FIGS. 33A and 33B. In this input circuit, the node 5p is grounded, and the nodes 7p, 8p and 9n are connected to the input node IN1.

FIG. 35 shows an input circuit for supplying a signal to non-inverting tri-state circuits corresponding to the circuits shown in FIGS. 33A and 33B. In this input circuit, both the input node IN1 and the enable signal input node EN are connected to the input node of a NAND circuit 331. The output node of the NAND circuit 331 is connected to the node 8p. The enable signal input node EN is connected to one of input nodes of a NOR circuit 333 via an inverter circuit 332. The input node IN1 is connected to the other input node of the NOR circuit 333. The output node of the NOR circuit 333 is connected to the nodes 9n and 7p. Further, the output node and input node IN1 of the inverter circuit 332 are connected to the input node of the OR circuit 334, and the output node of the OR circuit 334 is connected to the node 5p.

FIGS. 36A and 36B show output circuits from which the OR circuit 334 shown in FIG. 35 is removed.

In the output circuit shown in FIG. 36A, the MOS transistor P5 shown in FIG. 33A is replaced with a series circuit of MOS transistors P51 and P52, and the gates of the MOS transistors P51 and P52 are connected to the input node IN1 and enable signal input node $\overline{EN}$.

In the output circuit shown in FIG. 36B, the MOS transistor P5 shown in FIG. 33B is replaced with a series circuit of MOS transistors P51 and P52, and the gates of the MOS transistors P51 and P52 are connected to the input node IN1 and enable signal input node $\overline{EN}$. The N wells of the MOS transistors P51 and P52 are connected to the source of the MOS transistors P51 and P52, respectively. The N well of the MOS transistor P51 can be connected to the source of the MOS transistor P52. If the circuits shown in FIGS. 33A and 33B are modified as shown in FIGS. 36A and 36B, the OR circuit 334 shown in FIG. 35 can be removed.

FIG. 37 shows an input circuit for supplying a signal to analog inverting circuits, for example, amplifiers corresponding to the circuits shown in FIGS. 33A and 33B. In this input circuit, the node 7p is connected to the power supply Vcc, and the node 5p is grounded. The nodes 8p and 9n are connected to the input node IN1. A direct bias can be applied to the node 8p so that the MOS transistor P4 can serve as a constant current source.

FIGS. 38A and 38B show circuits for controlling the circuits shown in FIGS. 11B and 12B, respectively, in response to a clock signal.

In the circuits shown in FIGS. 38A and 38B, the drain of the N-channel MOS transistor N9 is connected to the drain of the MOS transistor P3. The P well and source of the MOS transistor N9 are both grounded. The gate of the MOS transistor N9 is connected to the node 20n. The drain of the P-channel MOS transistor P9 is connected to the source of the MOS transistor P4. The substrate of the MOS transistor P9, together with that of the MOS transistor P4, is connected to the source thereof. The gate of the MOS transistor P9 is connected to the node 20p.

FIGS. 39A and 39B show input circuits for controlling the circuits shown in FIGS. 38A and 38B in response to a clock signal.

In the input circuit shown in FIG. 39A, the input node IN1 is connected to the nodes 20p and 20n. The clock signal input node $\phi$ is connected to the node 7p and also connected to the nodes 5p, 2p and 8p via an inverter circuit 371. If, therefore, clock signals are supplied to the nodes 2p, 5p and 8p of the MOS transistors P3, P4 and P5, and an input signal is supplied to the MOS transistors P9 and N9, then the circuit is not caused to malfunction due to a difference in phase between clock signal $\phi$ and clock signal input node $\overline{\phi}$. Assume in this case that the input signal is transmitted to the output node OT1 in synchronization with the rise of the clock signal $\phi$.

In the input circuit shown in FIG. 39B, the input node IN1 is connected to the nodes 7p and 8p and connected to the nodes 2p and 5p through an inverter circuit 372. The clock signal input node $\overline{\phi}$ is connected to the node 20p and connected to the node 20n through an inverter circuit 373.

If the MOS transistors P4 and P9 are removed from the circuits shown in FIGS. 38A and 38B, an open drain type clocked pull-down circuit can be obtained.

FIG. 40 shows a circuit for increasing the fall time of the output voltages of the circuits shown in FIGS. 33A and 33B. In the circuit shown in FIG. 40, a P-channel MOS transistor P71 is connected in parallel to the N-channel MOS transistor N7 shown in FIGS. 33A and 33B, and the substrate of the MOS transistor P71 is connected to the source thereof. Furthermore, the gate of the MOS transistor N7, connected to the node 9n, is connected to that of the MOS transistor P71 through an inverter circuit 381 with this circuit arrangement, the fall time of the output voltage of the output node OT1 can be increased.

Figure 41A:
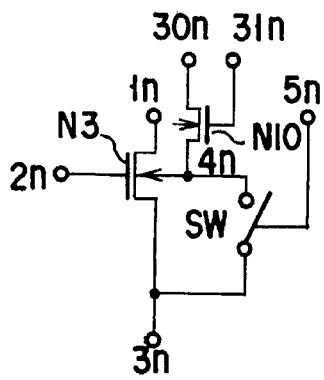
FIGS. 41A and 41B are circuit diagrams of improved circuits of the circuits shown in FIGS. 7A and 7B.
Figure 41B:
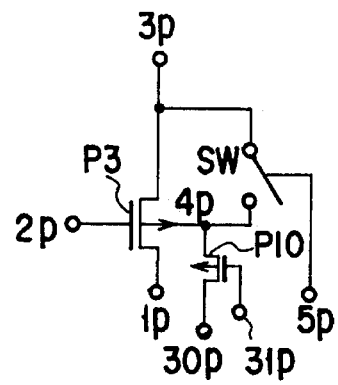

FIGS. 41A and 41B show improved circuits of the output circuits shown in FIGS. 7A and 7B.

In the circuit shown in FIG. 41A, the source of an N-channel MOS transistor N10 is connected to the substrate of the MOS transistor N4, that is, the node 4n. The drain of the MOS transistor N10 is connected to a node 30n, and the gate thereof is connected to a node 31n. Assume that the relationship in potential between the nodes 1n and 30n is V4nmax–0.6 V≦max{(V2n–Vthn), V1ln}, and 0.6 V is a PN junction potential.

In the circuit shown in FIG. 41A, when the MOS transistor N10 is turned on, it serves as a current path for supplying a base current to a bipolar transistor having the nodes 1n, 4n, and 3n serving as a collector, a base, and an emitter, respectively, to heighten the potential of the node 3n. Since the circuit performs a bipolar operation, a speed at which the initial potential of the node 3n is heightened is very high. This high-speed operation is performed for the following reason.

In the MOS transistor N3, the level of the node 4n of the MOS transistor N10 cannot be made higher than a lower value (V4nmax) of (potential of node 30n–VTHNB) and (potential of node 31n–VTHNB)(VTHNB: threshold voltage which is seemingly high due to the back gate bias effect). Therefore, the bipolar transistor is turned off if the potential of the node 3n is about V4nmax–0.6 V.

In the MOS transistor N3, the level of the node 3n can be increased up to a lower value of (potential of node 2n–VTHN) and (potential of node 1n). If the lower value is set higher than V4nmax–0.6 V, the level of the node 3n is finally the same as that in a case where the circuit does not include the MOS transistor N10.

The circuit shown in FIG. 41A has the advantages of avoiding the possibility of latch up as well as preventing an influence from being exercised on the level of the node 3n when the bipolar transistor is turned on at high speed. In the CMOS circuit, when a parasitic bipolar transistor is turned on, a large amount of current flows into the substrate, thereby causing latch up. The circuit therefore has the advantages of shortening the ON-time and lessening the possibility of latch up.

In the circuit shown in FIG. 41B, the source of a P-channel MOS transistor P10 is connected to the substrate of the MOS transistor P4 shown in FIG. 7B, that is, the node 4n. The drain of the MOS transistor P10 is connected to a node 30p, and the gate thereof is connected to a node 31p. Assume that the relationship in potential between the nodes 1p and 30p is V4pmin+0.6 V≧min{(V2p+lVthpl), v1p}.

In the circuit shown in FIG. 41B, when the MOS transistor P10 is turned on, it serves as a current path for supplying a base current to a bipolar transistor having the nodes 1p, 4p, and 3p serving as a collector, a base, and an emitter, respectively, to lower the potential of the node 3p.

Figure 42A:
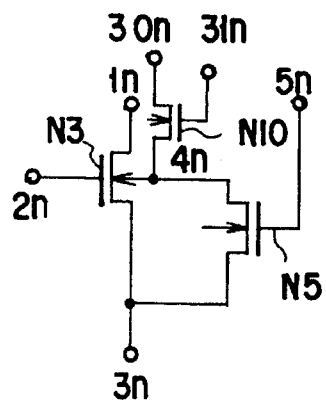
FIG. 42A is a circuit diagram of a circuit in which a MOS transistor N10 shown in FIG. 41A is connected to the circuit shown in FIG. 8A.
Figure 42B:
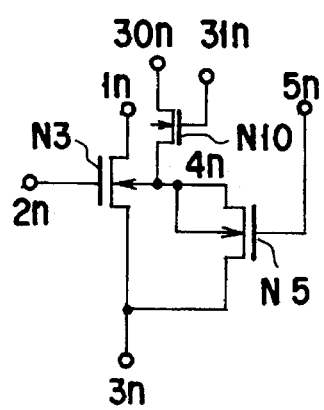
FIG. 42B is a circuit diagram of a circuit in which a MOS transistor P10 shown in FIG. 41B is connected to the circuit shown in FIG. 8B.

FIG. 42A shows a circuit in which the MOS transistor N10 shown in FIG. 41A is connected to the circuit shown in FIG. 8A, and FIG. 42B shows a circuit in which the MOS transistor N10 is connected to the circuit shown in FIG. 8A. The circuits shown in FIGS. 42A and 42B perform the same operation as that of the circuit shown in FIG. 41A.

Figure 43A:
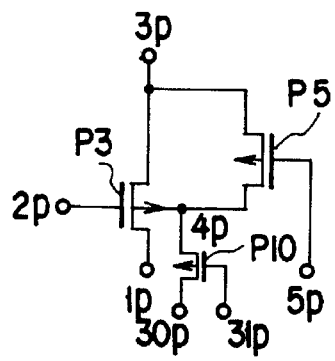
FIGS. 43A and 43B are circuit diagrams of circuits in which the source of the MOS transistor P10 shown in FIG. 41B is connected to the substrate of the MOS transistor P3 shown in FIGS. 9A and 9B.
Figure 43B:
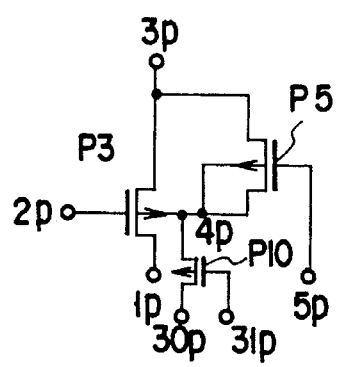

FIGS. 43A and 43B show circuits in which the source of the MOS transistor P10 is connected to the substrate of the MOS transistor P3 shown in FIGS. 9A and 9B. The circuits shown in FIGS. 43A and 43B perform the same operation as that of the circuit shown in FIG. 41B.

FIGS. 44A and 44B shows circuits in which the sources of the MOS transistors N10 and P10 are connected to the substrates of the MOS transistors N3 and P3 shown in FIGS. 10A and 10B, respectively.

FIGS. 45A and 45B shows circuits in which the sources of the MOS transistors N10 and P10 are connected to the substrates of the MOS transistors N3 and P3 shown in FIGS. 11A and 11B, respectively.

FIGS. 46A and 46B shows circuits in which the sources of the MOS transistors N10 and P10 are connected to the substrates of the MOS transistors N3 and P3 shown in FIGS. 12A and 12B, respectively.

The relationships in potential between the nodes in and 30n and between the nodes 1p and 30p in the circuits shown in FIGS. 44A and 44B, 45A and 45B, and 46A and 46B, are the same as those in the circuits shown in FIGS. 41A and 41B, and the operations of the MOS transistors N10 and P10 in the former circuits are basically the same as those in the circuits shown in FIGS. 41A and 41B.

The present invention is not limited to the above embodiments. Various changes and modifications can be made without departing from the scope of the subject matter of the present invention.

As described in detail, the present invention can provide an output circuit with a simple arrangement capable of outputting a voltage of a desired level even when the conductivity types of MOS transistors connected to an output node are the same.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An output circuit comprising:

an input terminal;

first and second MOS transistors of a same conductivity type connected in series between first and second power supplies to form a current path, and alternately turned on in response to an input signal from said input terminal, a level of said first power supply being higher than a level of said second power supply;

an output terminal connected to a connection point between said first and second MOS transistors;

a third MOS transistor having a first terminal connected to said output terminal and a second terminal connected to a back gate of said first MOS transistor, wherein a fixed potential is applied to a gate of said third MOS transistor; and a fourth MOS transistor having a first terminal connected to said back gate of said first MOS transistor and a second terminal connected to a fixed potential, and said fourth MOS transistor being turned on in response to the input signal and making a level of a back gate of said first MOS transistor equal to the level of said second power supply, thereby reliably turning off said first MOS transistor.

2. An output circuit comprising:

an input terminal;

an output terminal;

a first MOS transistor of a first conductivity type having a first terminal connected to a first potential, and turned on in response to a first input signal;

a second MOS transistor of a second conductivity type having a first terminal connected to a second terminal of said first MOS transistor and a second terminal connected to said output terminal, and a gate connected to the first potential, said second MOS transistor preventing a high-level signal supplied to said output terminal from being transferred to said second terminal of said first MOS transistor;

a third MOS transistor of the second conductivity type having a first terminal connected to said output terminal and a second terminal connected to a second potential, and turned on in response to a second input signal;

a fourth MOS transistor of the second conductivity type having a first terminal connected to a back gate of said second MOS transistor and a second terminal connected to said output terminal, and turned on in response to a third input signal; and a fifth MOS transistor having a a first terminal connected to said back gate of said second MOS transistor and a second terminal connected to the second potential, and turned on in response to a fourth input signal.

3. The output circuit according to claim 2, wherein a back gate of said fourth MOS transistor is connected to the second potential.

4. The output circuit according to claim 2, wherein a back gate of said fourth MOS transistor is connected to the output terminal.

5. An output circuit comprising:

an input terminal;

a disable signal input terminal;

a control signal generating circuit for generating first and second control signals upon receipt of an input signal and a disable signal from said input terminal and said disable signal input terminal;

first and second MOS transistors of the same conductivity type connected in series between first and second power supplies to form a current path, and alternately turned on in response to the first and second control signals;

an output terminal connected to a connection point between said first and second MOS transistors;

a third MOS transistor of the same conductivity type as said first and second MOS transistors, said third MOS transistor having one terminal connected to a back gate of said first MOS transistor, a gate which receives said first control signal, and a back gate connected to said second power supply;

a fourth MOS transistor of the same conductivity type as said first and second MOS transistors, said fourth MOS transistor having a first terminal connected to said second power supply, a second terminal connected to the back gate of said first MOS transistor, a gate for receiving the input signal and a back gate connected to said second power supply; and a fifth MOS transistor of the same conductivity type as said first and second MOS transistors, said fifth MOS transistor having a first terminal connected to said second power supply, a second terminal connected to the back gate of said first MOS transistor, a gate for receiving the disable signal and a back gate connected to said second power supply.

6. An output according to claim 5, wherein said control signal generating circuit generates the first and second control signals making said output terminal enter a high-impedance state when the disable signal is maintained at a first level.

7. An output circuit according to claim 6, wherein said first and second control signals are maintained at a second level when the disable signal is at the first level.

8. An output circuit comprising:

an input terminal;

a disable signal input terminal;

a control signal generating circuit for generating first and second control signals upon receipt of an input signal and a disable signal from said input terminal and said disable signal input terminal;

first and second MOS transistors of the same conductivity type connected in series between first and second power supplies to form a current path, and alternately turned on in response to the first and second control signals;

an output terminal connected to a connection point between said first and second MOS transistors;

a third MOS transistor of the same conductivity type as said first and second MOS transistors, said third MOS transistor having one terminal connected to a back gate of said first MOS transistor, a gate which receives said first control signal and a back gate connected to the back gate of said first MOS transistor;

a fourth MOS transistor of the same conductivity type as said first and second MOS transistors, said fourth MOS transistor having a first terminal connected to said second power supply, a second terminal connected to the back gate of said first MOS transistor, a gate for receiving the input signal, and a back gate connected to said second power supply; and a fifth MOS transistor of the same conductivity type as said first and second MOS transistors, said fifth MOS transistor having a first terminal connected to said second power supply, a second terminal connected to the back gate of said first MOS transistor, a gate for receiving the disable signal and a back gate connected to said second power supply.

9. An output circuit according to claim 8, wherein said control signal generating circuit generates the first and second control signals making said output terminal enter a high-impedance state when the disable signal is maintained at a first level.

10. An output circuit according to claim 9, wherein the first and second control signals are maintained at a second level when the disable signal is at the first level.

11. An output circuit comprising:

an input terminal;

a disable signal input terminal a control signal generating circuit for generating first and second control signals upon receipt of an input signal and a disable signal from said input terminal and said disable signal input terminal;

first and second MOS transistors of the same conductivity type connected in series between first and second power supplies to form a current path, and alternately turned on in response to the first and second control signals;

an output terminal connected to a connection point between said first and second MOS transistors;

a third MOS transistors of the same conductivity type as said first and second MOS transistors, said third MOS transistor having one terminal connected to a back gate of said first MOS transistor, a gate which receives the first control signal, and a back gate connected to said second power supply;

a fourth MOS transistor of the same conductivity type as said first and second MOS transistors, said fourth MOS transistor having a first terminal connected to said second power supply, a second terminal connected to the back gate of said first MOS transistor, a gate for receiving said second control signal and a back gate connected to said second power supply; and a fifth MOS transistor of the same conductivity type as said first and second MOS transistors, said fourth MOS transistor having a first terminal connected to said second power supply, and a second terminal connected to the back gate of said first MOS .transistor, a gate for receiving the disable signal and a back gate connected to said second power supply.

12. An output circuit according to claim 11, wherein said control signal generating circuit generates the first and second control signals making said output terminal enter a high-impedance state when the disable signal is maintained at a first level.

13. An output circuit according to claim 12, wherein said first and second control signals are maintained at a second level when the disable signal is at the first level.

14. An output circuit comprising:

an input terminal;

a disable signal input terminal;

a control signal generating circuit for generating first and second control signals upon receipt of an input signal and a disable signal from said input terminal and said disable signal input terminal;

first and second MOS transistors of the same conductivity type connected in series between first and second power supplies to form a current path, and alternatively turned on in response to the first and second control signals;

an output terminal connected to a connection point between said first and second MOS transistors;

a third MOS transistor of the same conductivity type as said first and second MOS transistors, said third MOS transistor having one terminal connected to a back gate of said first MOS transistor, a gate which receives the first control signal and a back gate connected to the back gate of said first MOS transistor;

a fourth MOS transistor of the same conductivity type as said first and second MOS transistors, said fourth MOS transistor having a first terminal connected to said second power supply, a second terminal connected to the back gate of said first MOS transistor, a gate for receiving the second control signal, and a back gate connected to said second power supply; and a fifth MOS transistor of the same conductivity type as said first and second MOS transistors, said fifth MOS transistor having a first terminal connected to said second power supply, a second terminal connected to the back gate of said first MOS transistor, a gate for receiving the disable signal and a back gate connected to said second power supply.

15. An output circuit according to claim 14, wherein said control signal generating circuit generates the first and second control signals making said output terminal enter a high-impedance state when the disable signal is maintained at a first level.

16. An output circuit according to claim 15, wherein said first and second control signals are maintained at a second level when the disable signal is at the first level.

* * * * *